United States Patent
Contreras et al.

(10) Patent No.: US 10,468,073 B2
(45) Date of Patent: Nov. 5, 2019

(54) TRANSMISSION LINE OPTIMIZATION FOR MULTI-DIE SYSTEMS

(71) Applicant: SanDisk Technologies LLC, Plano, TX (US)

(72) Inventors: John Thomas Contreras, Palo Alto, CA (US); Gokul Kumar, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/858,496

(22) Filed: Dec. 29, 2017

(65) Prior Publication Data

US 2019/0206450 A1    Jul. 4, 2019

(51) Int. Cl.
| | |
|---|---|
| G11C 5/06 | (2006.01) |
| H01L 25/065 | (2006.01) |
| H01L 23/522 | (2006.01) |
| H01L 23/00 | (2006.01) |
| G11C 5/04 | (2006.01) |

(52) U.S. Cl.
CPC ............ *G11C 5/063* (2013.01); *G11C 5/04* (2013.01); *H01L 23/5227* (2013.01); *H01L 23/5228* (2013.01); *H01L 24/02* (2013.01); *H01L 24/48* (2013.01); *H01L 24/49* (2013.01); *H01L 25/0657* (2013.01); *H01L 2224/48091* (2013.01); *H01L 2224/48105* (2013.01); *H01L 2224/48145* (2013.01); *H01L 2224/48149* (2013.01); *H01L 2224/49174* (2013.01); *H01L 2225/06506* (2013.01); *H01L 2225/06562* (2013.01); *H01L 2924/00014* (2013.01)

(58) Field of Classification Search
None
See application file for complete search history.

(56) References Cited

U.S. PATENT DOCUMENTS

| | | | |
|---|---|---|---|
| 8,929,119 B2 | 1/2015 | Lee et al. | |
| 9,245,825 B2 | 1/2016 | Ramachandra et al. | |
| 2005/0285262 A1 | 12/2005 | Knapp et al. | |
| 2006/0091900 A1* | 5/2006 | Kang | H04L 25/0284 326/30 |
| 2014/0036471 A1* | 2/2014 | Yuen | H05K 7/02 361/813 |
| 2014/0177189 A1 | 6/2014 | Liu et al. | |
| 2014/0192583 A1* | 7/2014 | Rajan | G11C 7/10 365/63 |
| 2017/0098469 A1 | 4/2017 | Park | |

* cited by examiner

*Primary Examiner* — James G Norman
(74) *Attorney, Agent, or Firm* — Brinks Gilson & Lione

(57) ABSTRACT

An apparatus may include a controller die configured to communicate with a plurality of dies via a transmission line. The controller die may be configured to transmit a signal on the transmission line to a target die of the plurality of dies, or the target die may transmit a signal on the transmission line. The transmission may be dependent on an end die of the plurality of dies setting an end-die termination resistance to a low level. In situations where the target memory is receiving the signal, the target die may set target an on-die termination resistance to a high level. In situations where the target memory die is transmitting the signal, the target die may set an on-die termination resistance to a low level.

23 Claims, 11 Drawing Sheets

US 10,468,073 B2

TRANSMISSION LINE OPTIMIZATION FOR MULTI-DIE SYSTEMS

BACKGROUND

A memory system may communicate signals carrying data, command, or clocking information for the storage of data within the memory system. The signals may be communicated along signal paths that each have an overall characteristic impedance. Within a single signal path, different portions or segments may have their own characteristic impedance, which contributes to the overall characteristic impedance of the signal path. In general, it may be desirable for each of these different portions or segments to have the same characteristic impedance or as close to the same characteristic impedance as possible. Conversely, different or substantially different characteristic impedances between two or more of the different portions can lead to undesirable energy reflection, leading to degradation in signal integrity and ultimately performance. Where impedance mismatches do occur, ways to minimize these impedance mismatches may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
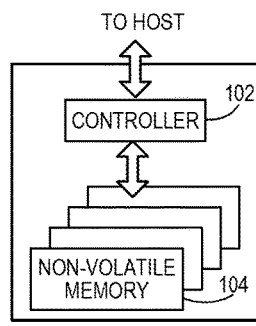
FIG. 1A is a block diagram of an example memory system.

By way of introduction, the below embodiments relate to optimizing characteristic impedances of transmission lines and on-die termination resistances coupled to the transmission lines in order to maximize communication efficiency during signal communication between a controller die and a plurality of memory dies. In one embodiment, an apparatus includes a controller die and a plurality of dies. A target die of the plurality of dies is configured to: transmit a signal on a transmission line to the controller die, where the transmission of the signal is dependent on an end die of the plurality of dies having set an end-die termination resistance circuit to a low resistance level.

In some embodiments, the transmission line comprises a wire bond element comprising a wire bond and an inductance-adding element.

In some embodiments, the inductance-adding element includes an extra wire bond, a spiral, or a seal ring.

In some embodiments, the plurality of dies is configured as a die stack, and a first edge displacement distance of a first pair of adjacent dies of the die stack is longer than a second edge displacement distance of a second pair of adjacent dies of the die stack.

In some embodiments, the transmission line includes a buffer disposed on a die of the plurality of dies.

In some embodiments, the target die is configured to transmit the signal on the transmission line to the controller die further dependent on a second-to-end die of the die stack having set a second-to-end die termination resistance circuit to a second low resistance level, where the second low resistance level is the same as or different than the first low resistance level.

In some embodiments, the target die is further configured to transmit the signal on the transmission line to the controller die further dependent on the target die having set a target die termination resistance to a second resistance level lower than the characteristic impedance of the transmission line.

In some embodiments, the second resistance level is at least 50% lower than a characteristic impedance of the transmission line.

In some embodiments, the plurality of dies is configured to have an effective termination resistance at a level that is within a range of resistance levels defined by plus-or-minus 20% of a characteristic impedance of the transmission line during transmission of the signal on the transmission line to the controller die.

In some embodiments, the target die is further configured to receive a second signal on a second transmission line from the controller die, where the receipt of the second signal on the second transmission line is dependent on the target die having set a target die termination resistance circuit to a high resistance level.

In some embodiments, the high resistance level is greater than ten times a characteristic impedance of the transmission line.

In some embodiments, the transmission line comprises a single-ended transmission line.

In some embodiments, the transmission line comprises a differential transmission line.

In a second embodiment, an apparatus includes a controller die, a die stack that includes a target die, and a transmission line coupled to the controller die and to the die stack. The target die of the die stack is configured to: set a target die termination resistance circuit to a low resistance level that is lower than a characteristic impedance of the transmission line; and transmit a signal on the transmission line, the transmission dependent on the target on-die termination resistance circuit set to the low resistance level.

In some embodiments, an end die of the die stack is configured to set an end-die termination resistance circuit to a second low resistance level that is higher than the first resistance level. The transmission of the signal is dependent on end die setting the end-die termination resistance circuit to the second low resistance level.

In some embodiments, the target die is further configured to receive a read command from the controller die, and set the target die termination resistance circuit to the low resistance level in response to receipt of the read command.

In some embodiments, the target die includes a second termination resistance circuit coupled to a second transmission line, and the target die is configured to receive the read command from on the second transmission line, and the target die is configured to set the second termination resistance circuit to a high resistance level for receipt of the read command.

In another embodiment, a system includes a memory die stack, and a controller die. The controller die is configured to: receive a host command from a host device, the host command indicating to perform a memory operation with a target memory die of the memory die stack, and in response to receipt of the host command, transmit a first signal on a first transmission line to the target memory die of the memory die stack, the transmission of the first signal dependent on an end memory die of the memory die stack having set a first end-die termination resistance circuit coupled to the first transmission line to a first low resistance level. Additionally, the target memory die, in response to receipt of the first signal, is configured to transmit a second signal on a second transmission line to the controller die, where the transmission of the second signal is dependent on the end memory die having set a second end-die termination resistance circuit coupled to the second transmission line to a second low resistance level, the second low resistance level being the same as or different than the first low resistance level.

In some embodiments, the transmission of the first signal is further dependent on the target memory die having set a first target on-die termination resistance circuit to a high resistance level, and wherein the transmission of the second signal is further dependent on the target memory die having set a second target on-die termination resistance circuit to a low resistance level.

In some embodiments, the memory die stack includes at least one effective end memory die that includes the end memory die. The transmission of the first signal is further dependent on remaining memory dies other than the target memory die and the at least one effective memory die having set respective on-die termination resistance circuit to associated high resistance levels. Also, the transmission of the second signal is further dependent on the remaining memory dies other than the target memory die and the at least one effective memory die having set respective on-die termination resistance circuits to the associated high resistance levels.

In some embodiments, the host command includes a host read command, the first signal includes a clock signal, and the second signal includes a data signal.

In some embodiments, the host command includes a host write command, the first signal includes a data signal, and the second signal includes a status signal.

In another embodiment, a system includes: means for receiving a host command from a host device, the host command indicating to perform a memory operation with a target memory die of a memory die stack; means for transmitting a signal on a first transmission line to the target memory die, the transmitting of the first signal dependent on an end memory die of the memory die stack having set a first end-die termination resistance circuit coupled to the first transmission line to a first low resistance level; and means for transmitting a second signal on a second transmission line in response to receipt of the first signal, the transmitting of the second signal dependent on the end memory die having set a second end-die termination resistance circuit coupled to the second transmission line to a second low resistance level, the second low resistance level being the same as or different than the first low resistance level.

Other embodiments are possible, and each of the embodiments can be used alone or together in combination. Accordingly, various embodiments will now be described with reference to the attached drawings.

Embodiments

The following embodiments describe systems, apparatuses, devices, circuits, and methods for optimizing characteristic impedances of transmission lines and on-die termination resistances coupled to the transmission lines during signal communication between a controller die and a plurality of memory dies. Optimizing for the characteristic impedance and on-die termination resistance may provide for more efficient signal communication and/or improved signal quality, including increased bandwidth, frequency, and/or transmission rate, higher signal-to-noise ratio, reduced jitter, and/or lower duty cycle distortion. Before turning to these and other embodiments, the following paragraphs provide a discussion of exemplary memory systems and storage modules that can be used with these embodiments. These are just examples, and other suitable types of systems, apparatuses, devices, or circuits, including other types of memory systems and/or storage modules, can be used.

FIG. 1A is a block diagram illustrating a memory system 100, such as a non-volatile memory system. The memory system 100 may include a controller 102 and memory that may be made up of a plurality of memory dies 104. As used herein, the term memory die refers to the set of memory cells (including non-volatile memory cells), and associated circuitry for managing the physical operation of those memory cells, that are formed on a single semiconductor substrate. In addition, the term die, in general, may refer to circuitry or circuit components on a single semiconductor substrate, but may or may not include memory cells to store data. The controller 102 may interface with a host system and transmit command sequences for read, program, and erase operations to the non-volatile memory dies 104. Herein, the controller 102 is referred to as a controller die 102 to identify or highlight that the circuitry of the controller 102 is configured or located on a die separate from the plurality of memory dies 104. The controller die 102 and each of the memory dies 104 may be configured or function as transceiver circuits, in that they each can transmit and receive signals. As described in further detail below, the controller die 102 and the plurality of memory dies 104 are configured to communicate with each other over a plurality of transmission lines.

The controller die 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller die 102 can be configured with hardware and/or firmware to perform the various functions described below. Also, some of the components shown as being internal to the controller die 102 can also be stored external to the controller die 102, and other components can be used. Additionally, the phrase "operatively in communication with" could mean directly in communication with or indirectly (wired or wireless) in communication with through one or more components, which may or may not be shown or described herein.

The controller die 102 is configured to manage data stored in memory cells of the memory dies 104 and also to communicate with a host, such as a computer or electronic device. The controller die 102 can have various functionality in addition to the specific functionality described herein. For example, the controller die 102 can format the memory cells and/or the circuitry of the memory dies 104 to ensure the memory dies 104 operate properly, map out bad or defective memory cells, and allocate spare cells to be substituted for future failed cells. Some part of the spare cells can be used to hold firmware to operate the controller die 102 and implement other features. In operation, when a host needs to read data from or write data to the memory die 104, the host communicates with the controller die 102. If the host provides a logical address to which data is to be read/written, the controller die 102 can convert the logical address received from the host to a physical address in the memory dies 102. (Alternatively, the host can provide the physical address). The controller die 102 may also be configured to perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller die 102 and the memory dies 104 may be any suitable memory interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Figure 1B:
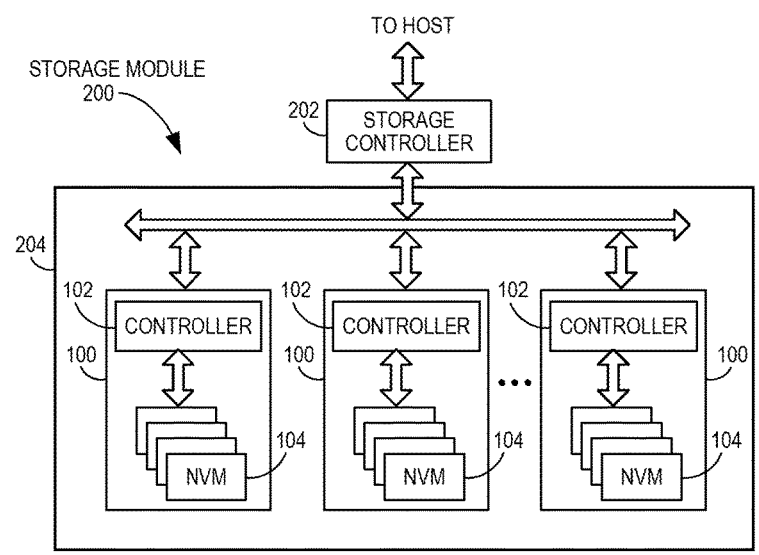
FIG. 1B is a block diagram of a storage module that includes a plurality of memory systems.

FIG. 1B illustrates a storage module 200 that includes a plurality of memory systems 100. As such, the storage module 200 may include a storage controller 202 that interfaces with a host and with a storage system 204, which includes a plurality of memory systems 100. The interface between the storage controller 202 and memory systems 100 may be a bus interface, such as a serial advanced technology attachment (SATA), a serial attached SCSI (SAS), a peripheral component interface express (PCIe) interface, an embedded MultiMediaCard (eMMC) interface, a SD interface, or a Universal Serial Bus (USB) interface, as non-limiting examples. The storage system 200, in one embodiment, may be a solid state drive (SSD), such as found in portable computing devices, such as laptop computers and tablet computers, and mobile phones.

Figure 1C:
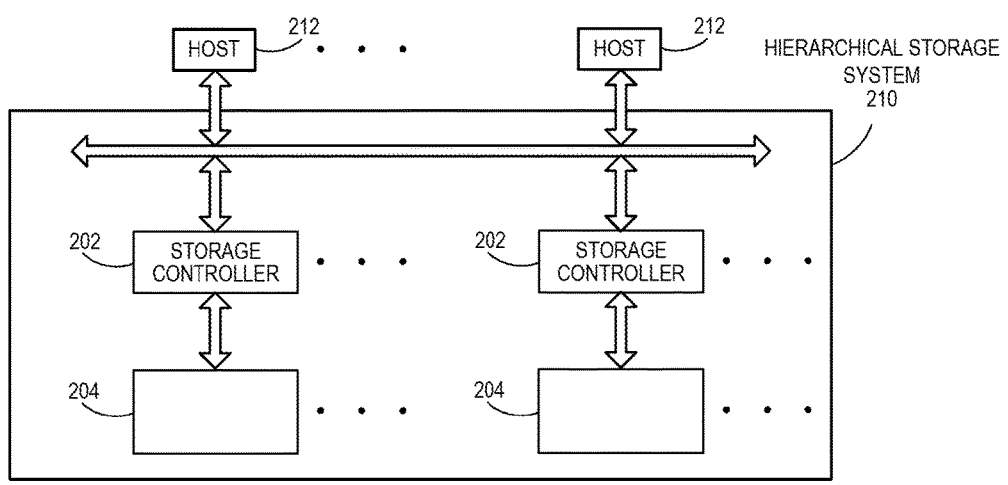
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a SAS interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
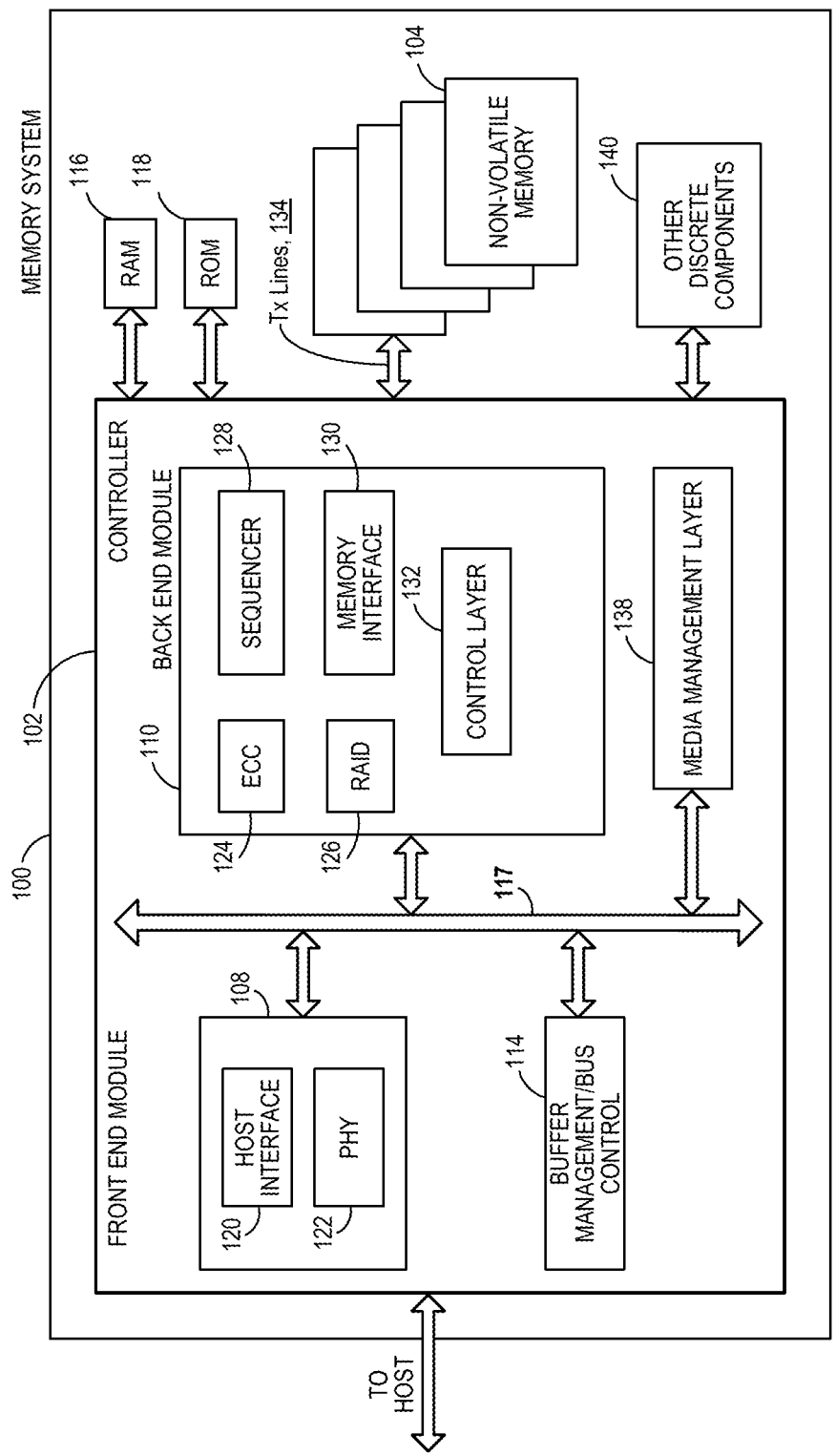
FIG. 2A is a block diagram of example components of a controller of the memory system of FIG. 1A.

FIG. 2A is a block diagram illustrating exemplary components of the controller die 102 in more detail. The controller die 102 may include a front end module 108 that interfaces with a host, a back end module 110 that interfaces with the memory dies 104, and various other modules that perform various functions of the memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller die 102 may include a buffer manager/bus controller module 114 that manages buffers in random access memory (RAM) 116 and controls the internal bus arbitration for communication on an internal communications bus 117 of the controller die 102. A read only memory (ROM) 118 may store and/or access system boot code. Although illustrated in FIG. 2A as located separately from the controller die 102, in other embodiments one or both of the RAM 116 and the ROM 118 may be located within the controller die 102. In yet other embodiments, portions of RAM 116 and ROM 118 may be located both within the controller die 102 and outside the controller die 102. Further, in some implementations, the controller die 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the memory dies 104. Additionally, the back end module 110 may include a RAID (Redundant Array of Independent Drives) module 128 that manages generation of RAID parity and recovery of failed data. The RAID parity may be used as an additional level of integrity protection for the data being written into the memory system 100. In some cases, the RAID module 128 may be a part of the ECC engine 124.

In addition, the back end module 110 may include a command sequencer 128 and a memory interface 130. The command sequencer may be configured to generate command sequences, such as program, read, and erase command sequences, to be transmitted to the memory dies 104. The commands of the command sequences that the command sequencer 128 outputs may be referred to as context commands. For example, commands of command sequences for read operations may be referred to as read context commands, and commands of command sequences for write operations may be referred to as write context commands.

The memory interface 130 is configured to output the command sequences or context commands to the memory dies 104 and receives status information from the memory dies 104. Along with the command sequences and status information, the memory interface 130 may also be configured to send and receive data, such as in the form of data signals, to be programmed into and read from the memory dies 104. The memory interface 130 may also be configured to output clock signals or strobe signals to control the timing at which the memory dies 104 receive data signals carrying data to be programmed and/or at which the memory dies 104 output data signals carrying data the controller die 102 wants read from the memory dies 104. The memory interface 130 may have any of various configurations to send and receive signals. Example circuit components include input/output (I/O) driver circuitry (e.g., push-pull circuits, amplifiers, buffers, Schmitt trigger circuits, on-die termination resistance circuits, etc.) to generate and receive the signals, and I/O contact pads that communicate signals between transmission lines 134 and the I/O driver circuitry. In one embodiment, the memory interface 130 may be a double data rate (DDR) interface, such as a Toggle Mode 200, 400, or 800 interface. In some example configurations, the controller die 102 may include a control layer 132 (e.g., a flash controller layer) that controls the overall operation of back end module 110.

As shown in FIG. 2A, the memory system 100 may include a plurality of transmission (Tx) lines 134 connecting the controller die 102 and the plurality of memory dies 104. In general, a transmission line is any conductive structure or combination of conductive structures configured to conduct alternating current (AC) or radio frequency (RF) signals from a transmitter that is transmitting the signals to a receiver that is receiving the signals. For the example memory systems described herein, transmission lines are included to communicate signals between (including to and from) the controller die 102 and the memory dies 104. The controller die 102 and the memory dies 104 may be configured to communicate signals, including data signals, clock signals, command signals, over the plurality of transmission (Tx) lines 134. A signal that is communicated between the controller die 102 and the memory dies 104 may be either transmitted from the controller die 102 over one of the transmission lines 134 to the memory dies 104, or transmitted from the memory dies 104 over one of the transmission lines 134 to the controller die 102. In this context, the controller die 102 and each of the memory dies 104 may be configured as transceiver circuits (or dies) in that they may each be configured to transmit and receive signals. Additionally, the transmission lines 134 may be coupled to the transmission lines 134 via its memory interface 130. That is, when the controller die 102 wants to send a signal to the memory dies 104, the controller die 102 may send the signal through its memory interface 130 onto one of the transmission lines 134. The memory dies 104 may each have their own respective memory interfaces to send and receive signals, as described in further detail below with respect to FIG. 3. When referring to the memory interfaces, the memory interface of the controller die 102 may be referred to as a controller-side memory interface 130, and the memory interfaces of the memory dies 104 may be referred to as memory-side memory interfaces.

Additional modules of the non-volatile memory system 100 illustrated in FIG. 2A may include a media management layer 138, which may perform certain memory functions, such as address management (e.g., address translation) and wear leveling of memory cells of the memory dies 104. The memory system 100 may also include other discrete components 140, such as external electrical interfaces, external RAM, resistors, capacitors, or other components that may interface with the controller die 102. In alternative embodiments, one or more of the RAID module 128, media management layer 138 and buffer management/bus controller 114 are optional components that may not be necessary in the controller die 102.

Figure 2B:
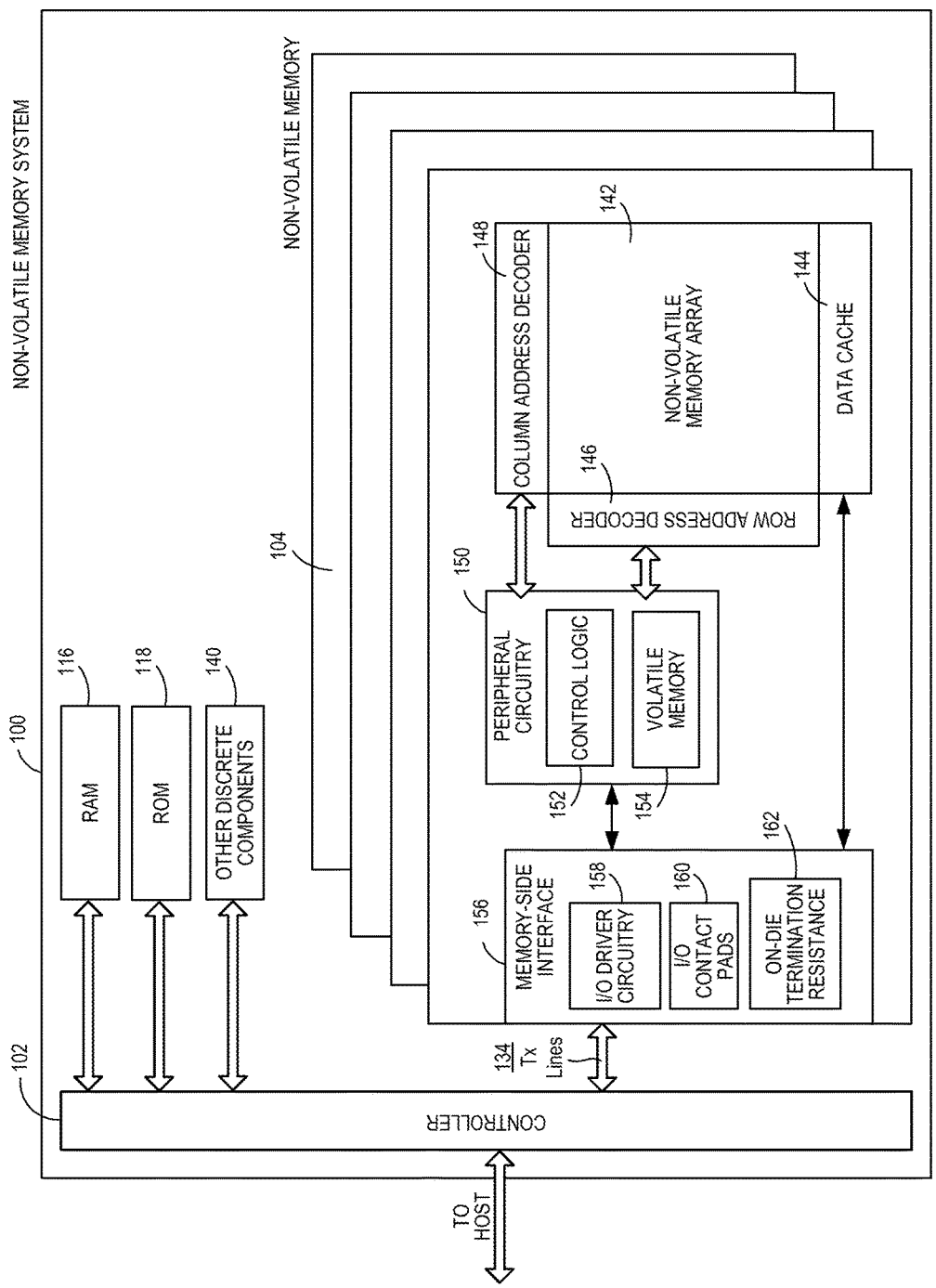
FIG. 2B is a block diagram of example components of a non-volatile memory die of the memory system of FIG. 1A.

FIG. 2B is a block diagram illustrating exemplary components of one of the memory dies 104 in more detail. The non-volatile memory die 104 may include a memory cell structure 142. In some example configurations, the memory cell structure 142 may be configured in the form of an array, such as two-dimensional or a three-dimensional array.

Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include a page buffer or data cache 144 that caches data that is sensed from and/or that is to be programmed to the memory cell structure 142. The memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the memory die 104 may include peripheral circuitry 150. The peripheral circuitry 150 may include control logic circuitry (otherwise referred to as an on-chi controller or simply controller) 152, which may be implemented as a state machine, that provides on-chip control of memory operations as well as provide status information to the controller 102. The peripheral circuitry 150 may also include volatile memory 154. An example configuration of the volatile memory 154 may include latches, although other configurations are possible.

Also, the memory die 104 may include a memory-side interface 156 that is configured to interface and communicate with the memory interface 130 of the controller die 102. In particular, the memory-side interface 156 may be configured to coupled with at least some of the transmission lines 134 of the memory system 100. When a given memory die 104 is to transmit a signal to the controller die 102, the given memory die 104 may transmit the signal via its memory-side interface 156 onto one of the transmission lines 134 to the controller die 102. Additionally, when a given memory die 104 is to receive a signal from the controller die 102, the given memory die 104 may receive the signal via its memory-side interface 156 from one of the transmission lines 134. As described in further detail below, components of the memory-side interface 156, along with die capacitance of the dies may form part of and/or determine characteristics impedances of the transmission lines 134.

The memory-side interface 156 may include input/output (I/O) driver circuitry 158 that is configured to generate and receive signals, including data signals carrying data, command signals identifying commands, clock signals, or other types of signals carrying other information to be transmitted to and received from the controller die 102. For example, data sensed into the data cache 144 may be sent to the I/O driver circuitry 158 for transmission to the controller die 102. Similarly, data received from the controller die 102 may be received by the I/O driver circuitry 158, and the I/O driver circuitry 158 may communicate the data to the data cache 144. Additionally, commands to be communicated between the controller die 102 and the control logic 152 may be communicated via the I/O driver circuitry 158. The I/O driver circuitry 158 may have any of various circuit or combinations of circuits, examples of which include push-pull circuits, amplifiers, buffers, Schmitt-trigger circuits, combinations thereof, or any other suitable circuit configured to receive a signal from a transmission line or output a signal into a transmission line.

Additionally, the memory-side interface 156 may include input/output (I/O) contact pad portions 160 in communication with the I/O driver circuitry 158 that is configured to send signals to and receive signals from the I/O driver circuitry 158. For example, the signals that the I/O circuitry 158 generates for transmission to the controller die 102 may be communicated from the I/O driver circuitry 158 to the I/O contact pads 160. Similarly, the signals that the memory-side interface 156 receives from the controller die 102 may be sent from the I/O contact pads 160 to the I/O driver circuitry 158. In addition, as described in further detail below, the I/O contact pads 160, along with wire bond elements (WBE) (shown in FIG. 3) may form or be part of the transmission lines 134 over which the memory dies 104 and the controller die 102 communicate signals between each other.

Also, as shown in FIG. 2B, the memory-side interface 156 may include on-die termination (ODT) resistance circuitry 162, which may include one or more resistors or other circuit components providing a resistance. The on-die termination resistance 162 may provide termination resistance or impedance for the transmission lines 134, and may be used for impedance matching between the memory dies 104 and the characteristic impedances of the transmission lines 134. Resistors of the on-die termination resistance circuitry 162 may be connected to the I/O contact pads 160. In addition, the on-die termination resistance circuitry 162 may provide variable resistance levels or values, including one or more high levels and one or more low levels, as described in further detail below. The resistance levels or values that the on-die termination resistances provide may be controlled by the controller die 102, the on-die control logic 152, or a combination thereof.

Figure 3:
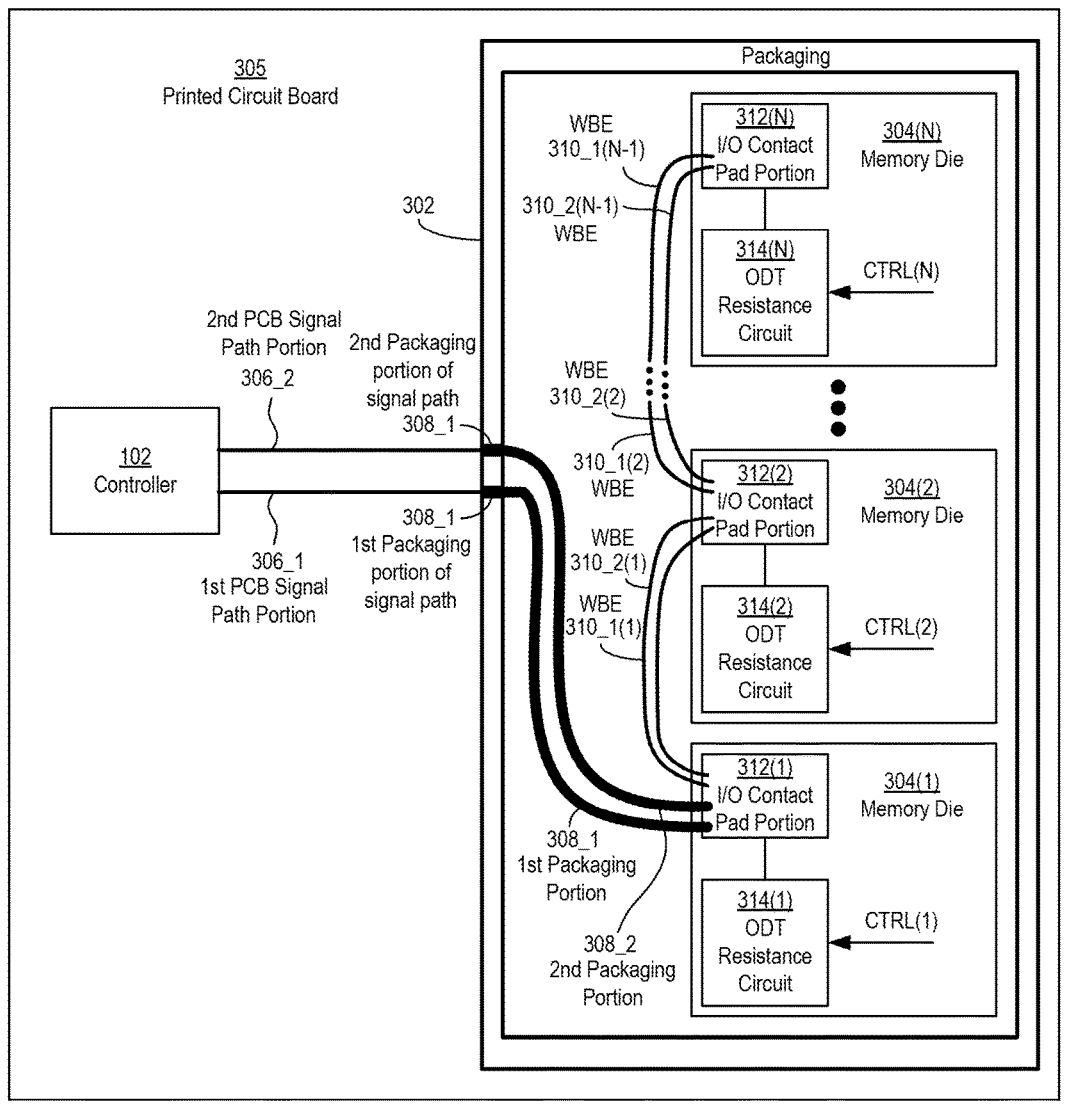
FIG. 3 is a block diagram of a structural layout of the controller and an N-number of a plurality of memory dies of FIGS. 1A-2B.

FIG. 3 shows a block diagram of a structural layout of the controller die 102 and an N-number of the plurality of memory dies 304, including a first memory die 304(1), a second memory die 304(2), and an Nth memory die 304(N). N may be any integer of two or more. The N-number of memory dies 304(1)-304(N) may be all of the memory dies 104 in the memory system 100, or may be less than all of the memory dies 104. For example, the N-number of memory dies 304(1)-304(N) may be located on the same chip and/or may be part of the same chip enable group. The memory system 100 may include a single chip or chip enable group in which the memory dies 104 are located. The N-number of dies 304 of FIG. 3 may be representative of that single chip or chip enable group of dies. Alternatively, the memory system 100 or may include multiple chips or chip enable groups, and some of the memory dies 104 may be located on one chip or in one chip enable group, while other memory dies 104 may be located on one or more other chips or in one or more other chip enable groups. The N-number of dies 304 of FIG. 3 may be representative of one of the plurality of chips or chip enable groups. In addition or alternatively, the N-number of dies 304 may be configured as or part of the same die stack. Various configurations are possible. Further details of dies configured as a die stack is described in further detail below with reference to FIG. 4.

In the example configuration shown in FIG. 3, the memory dies 304(1)-304(N) may be configured in and/or integrated with a packaging 302, which may include various packaging components such as a die substrate, traces and vias integrated in the die substrate, solder balls, contact pads, wire bonds, and a cover, as non-limiting examples. The controller die 102 may be configured and/or implemented as its own chip and/or integrated with its own packaging separate to that of the memory dies 304(1)-304(N). The controller die 102 and the memory dies 304(1)-304(N) integrated with the packaging 302 may be integrated on a printed circuit board 305, as shown in FIG. 3.

The controller die 102 and the memory dies 304(1)-304(N) may communicate signals between each other on transmission lines (e.g., at least some of the transmission lines 134 of FIGS. 2A and 2B) connecting the controller die 102 and the memory dies 304(1)-304(N). For simplicity, the physical layout of FIG. 3 shows a single transmission line connecting the controller die 102 and the memory dies 304(1)-304(N). However, in actual implementation as described with reference to FIGS. 2A and 2B, there may be multiple transmission lines between the controller 102 and the memory dies 304(1)-304(N) configured to communicate data signals, clock signals, strobe signals, command signals, status signals, or any other type of signals between the controller die 102 and the memory dies 304. For example, at a minimum, there may be a first transmission line over which the controller die 102 sends signals to the memory dies 304, and a second transmission line over which the memory dies 304 send signals to the controller die 102. In addition, at least some of the multiple transmission lines may be configured in parallel with each other such that two or more signals propagating on two or more parallel transmission lines may be communicated separately and/or simultaneously. As mentioned, each transmission line may be configured to carry one of more signals, with each signal being a data signal, a command signal, a clock signal, or any other type of signal that may be communicated between the controller 102 and the memory dies 304(1)-304(N), including those for performance of memory operations.

In some example configurations, the transmission line may be configured as a single-ended transmission line or signal path configured to communicate a single-ended signal. For other example configurations, the transmission line may be configured as a differential transmission line or signal path configured to communicate a differential signal. For either of the configurations, the transmission line may include a first conductive path and a second conductive path. As described in further detail below, the transmission line and/or its first and second conductive paths, may include any of various types of conductive elements, such as traces, vias, solder balls, contact pads, wire bonds, as non-limiting examples, to communicate a signal between the controller 102 and the memory dies 304.

For single-ended configurations, the first path may be a signal path component or portion (or just signal path) of the transmission line, and the second path may be a ground reference or return component or portion (or just ground path or return path) of the transmission line. A single-ended signal communicated along the signal path may be a single signal or have a single signal component (e.g., a voltage or current data transitions including a clock signal oscillating at a certain frequency) that propagates along the signal path with reference to the ground reference path.

For differential configurations, both the first path and the second path may be signal paths, each configured to communicate a respective signal component of the differential signal. That is, the differential signal communicated on the differential signal path may include a first signal component (or just first signal) and a second signal component (or just second signal). As a differential signal, the first signal component and the second signal component may have amplitudes that are inversely related or are inverses of each other, and in some cases, have amplitudes that are equal in magnitude and opposite in polarity, at any of various moments in time during signal propagation along the differential signal path. The first signal component of the differential signal may propagate along a first signal path of the differential signal path, and the second signal component of the differential signal may propagate along a second signal path of the differential signal path.

In general, in the example configuration shown in FIG. 3, the transmission line, whether it be for a single-ended configuration or a differential configuration, may include a printed circuit board (PCB) portion 306, a packaging portion 308, a wire bond portion 310, and an input/output (I/O) contact pad portion 312. The portions or components of the first path of the transmission line are referred to as first portions or components, and the portions or components of the second path of the transmission line are referred to as second portions or components. In addition, the transmission line and/or the first and second paths may further include or be coupled to a termination resistance of the controller 102 (not shown in FIG. 3) and an on-die termination (ODT) resistance 314 of the memory dies 304. Other transmission line configurations may include fewer, additional, or other portions compared to the portions shown in FIG. 3.

In further detail, the first path may include a first PCB portion 306_1 and the second path may include a second PCB portion 306_2. Each of the first and second PCB portions 306_1, 306_2 may be integrated with the printed circuit board 305 and extend between the controller 102 and the packaging 302. In addition, the first and second PCB portions 306_1, 306_2 may each be implemented as a conductive trace (such as in the form of a microstrip or a stripline, for example), one or more vias, a combination of traces and vias, or any other type of conductive element configured to carry a signal over the printed circuit board 305 from the controller die 102 to the packaging 302.

In addition, the first path may include a first packaging portion 308_1, and the second path may include a second packaging portion 308_2. The first and second PCB portions 306_1, 306_2 may be connected to their respective first and second packaging portions 308_1, 308_2. In general, the packaging portions 308_1, 308_2 may be configured to communicate signals on the transmission line from the PCB portion 306 to the memory dies 304. The first and second packaging portions 308_1, 308_2 may each include any of various conductive elements to do so, examples of which include solder balls, such as those of a ball grid array structure, vias and/or traces integrated in a die substrate, contact pads, and wire bonds. Various configurations for connecting the PCB portion 308 of the transmission line with the I/O contact pads of the memory dies 304 are possible.

Additionally, the first path may include a first set of wire bond elements (WBE) 310_1, and the second path may include a second set of wire bond elements 310_2. Each wire bond element 310 may include a wire bond. Also, as described in further detail below, in some example configurations, at least one wire bond element 310_1 of the first path and/or at least one wire bond element 310_2 of the second path may include an additional conductive structure, referred to as an inductance-adding element, that adds an amount of inductance to an amount of inductance that the wire bond of the wire bond element provides. Types of additional conductive structures are described in further detail below.

In the example configuration shown in FIG. 3, the I/O contact pad portions 312 include an N-number of I/O contact pad portions 312(1) to 312(N). Each contact pad portion 312 may include at least two contact pads, including a first contact pad that is part of the first path and a second contact pad that is part of the second path. For clarity, the two different or separate contact pads of a given I/O contact pad portion 312 are not shown in FIG. 3. Also, for configurations where the transmission line is configured to transmit signals from the controller die 102 to the memory dies 304, the contact pads that are part of the transmission line are referred to as input contact pads. In addition, for configurations where the transmission line is configured to transmit signals from the memory dies 304 to the controller die 102, the contact pads that are part of the transmission line are referred to as output contact pads.

In addition, each wire bond element 310 may be configured to connect a contact pad on one memory die 304 with a contact pad of another, different memory die 304. For example, a first wire bond element 310_1(1) of the first path may connect a contact pad of a first I/O contact pad portion 312(1) of the first memory die 304(1) with a contact pad of a second I/O contact pad portion 312(2) of the second memory die 304(2). Similarly, an (N−1)th wire bond element 310_2(N−1) of the second path may connect a contact pad of a (N−1)th I/O contact pad portion 312(N−1) of an (N−1)th memory die 304(N−1) (not shown) with a contact pad of a Nth I/O contact pad portion 312(N) of the Nth memory die 304(N).

The wire bond elements 310 and the I/O contact pad portions 312, in combination, may form a part or a portion of the transmission line, with each I/O wire bond element 310 and each I/O contact pad portion 312 having positions relative to each other in the transmission line that correspond to propagation delay or electrical distance from the packaging portion 308. A signal transmitted from the controller 102 may take a shorter amount of time to reach a given contact pad or a given wire bond element positioned electrically closer to the packaging portion 308 compared to a given contact pad or a given wire bond element positioned electrically farther from the packaging portion 308.

The memory dies 304, the wire bond elements 310, and the I/O contact pad portions 312 are numbered in FIG. 3 to correspond to their respective positions in the transmission line. Given an index k, the higher the value of k, the further the kth wire bond element WBE(k) and the kth I/O contact pad portion 312(k) are in the transmission line with respect to lower numbered wire bond elements 310 and I/O contact pad portions 312, and/or from the packaging portion 308, the PCB portion 306, and the controller 102. The Nth I/O contact pad portion 312(N) may be a memory-side end or termination of the transmission line. Additionally, a contact pad on the controller die 102 may be a controller-side end or termination of the transmission line. In this context, the Nth die 304 may be referred to as an end die or a termination die of the plurality of dies 304 since it has the contact pads forming the memory-side termination of the transmission line—i.e., the contact pads electrically positioned on the transmission line farthest from the packaging portion 308, the PCB portion 306, and the controller die 102.

Accordingly, in a situation where the controller 102 transmits a signal to a kth memory die 304(k), a pulse of the signal will have propagated over a (k−1)-number of I/O contact pad portions 312 and a (k−1)-number of wire bond elements 310 before reaching the kth I/O contact pad portion 312(k). Similarly, when a kth memory die 304(k) transmits a signal to the controller 102, upon a pulse of the signal being output at the kth I/O contact pad portion 312(k), the pulse will propagate over a (k−1)-number of wire bond elements 312 and a (k−1) number of I/O contract pad portions 312 before reaching the packaging portion 308. Additionally, upon being output at the kth I/O contact pad portion 312(k), the pulse may also propagate over an (N−k)-number of wire bond elements 310 and an (N−k)-number of I/O contact pad portions 312.

In addition, the N-number of memory dies 304(1)-304(N) may be part of the same chip group. The memory dies 304(1)-304(N) may be part of the same chip group by being located within the same packaging 302, having their respective I/O contact pad portions 312(1)-312(N) electrically connected to the same packaging portion 308 and/or the same PCB portion 306 between the controller die 102 and the packaging 302, being identified by the controller die 102 as being part of the same chip group, or some combination thereof.

The N-number of memory dies 304 may be configured in any of various ways within the memory system. In one example configuration, the N-number of dies 304 may be configured as a die stack, and in particular as a staircase stack. In general, a given die may be a generally planar structure having two opposing planar surfaces, including a first planar surface and a second planar surface. In a die stack, the dies may be disposed on or "stacked" on top of one another, starting with a first or base die and extending in a direction perpendicular to planar surfaces of the dies. As a die stack, one planar surface of one die may face and/or contact a planar surface of a second die. Also, two dies are adjacent to each other where no other dies of the stack are disposed in between them. Also, in some example configurations, a first or base die may be disposed or mounted on a base substrate or a printed circuit board directly. A last or Nth die of the stack may be the die that is disposed further from the base substrate or printed circuit board on which the die stack is mounted. Also, for embodiments where the die stack is configured as a staircase stack, the dies may be stacked on top of one another such that the dies do not completely cover each other, and instead such that each die has an exposed portion where respective I/O contact pad portions may be disposed and connected with each other via wire bonds. By disposing on the dies on top of one another to create exposed portions, the dies of the die stack, when viewed from the side, have a "staircase" shape, which each die being one of the "steps" of the staircase.

Figure 4:
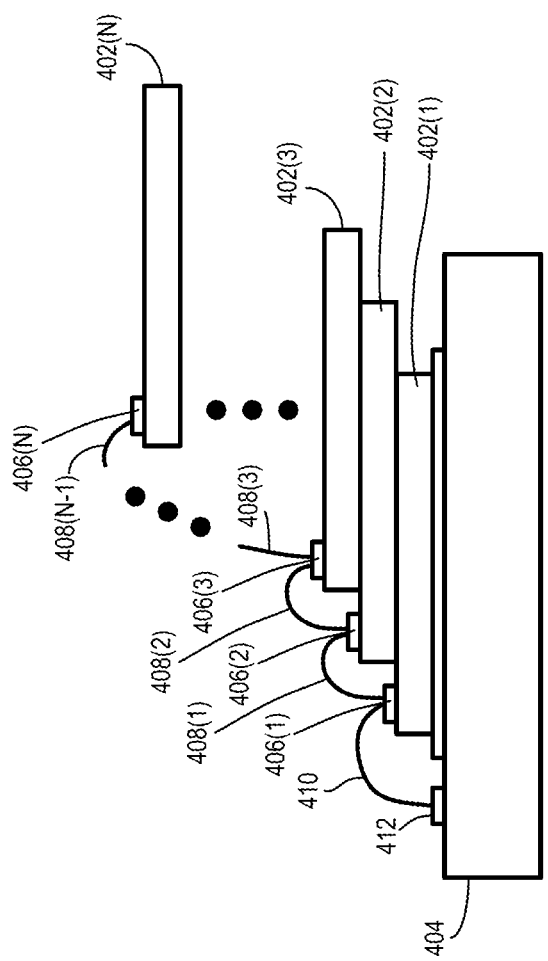
FIG. 4 is cross-sectional side view of a plurality of memory dies integrated as a stack.

FIG. 4 shows a cross-sectional side view of a plurality of memory dies 402(1)-402(N) integrated or configured as a staircase stack. The plurality of memory dies 402(1)-402(N) may be representative of the plurality of memory dies 304(1)-304(N), and illustrate an example configuration in which the plurality of memory dies 304(1)-304(N) may be integrated with each other and the packaging 302.

In the example configuration shown in FIG. 4, the stack of dies 402 may be disposed on a die substrate 404. In particular, a first die 402(1) may be in contact with and/or be the closest of the memory dies 402 to the die substrate. In addition, the other memory dies 402(2)-402(N) are stacked on the first memory die 602(1) in a staircase configuration such that the second memory die 402(2) is disposed on the first memory die 402(1), the third memory die 402(3) is disposed on the second memory die 402(2), and the Nth memory die 402(N) is disposed on the (N−1)th memory die 402(N−1) (not shown).

Also, each of the memory dies 402(1)-402(N) may have contact pads of respective I/O contact pad portions. The cross-sectional side view of FIG. 4 shows only one of the paths, and accordingly shows contact pads 406 for the single path shown in FIG. 4. For the single path shown, the first memory die 402(1) may include a first contact pad 406(1), the second memory die 402(2) may include a second contact pad 406(2), the third memory die 402(3) may include a third contact pad 406(3), and the Nth memory die 402(N) may include an Nth contact pad 406(N).

The path shown in FIG. 4 may also include an N−1 number of wire bond elements 408. Each ith wire bond element 408(i) may connect an ith contact pad with an (i+1)th contact pad 406(i+1). For example, a first wire bond element 408(1) may connect the first contact pad 406(1) with the second contact pad 406(2), a second wire bond element 408(2) may connect the second contact pad 406(2) with the third contact pad 406(3), a third wire bond element 408(3) may connect the third contact pad 406(3) with a fourth contact pad 406(4) (not shown), and an (N−1)th wire bond element 408(N−1) may connect an (N−1)th contact pad 406(N−1) (not shown) with the Nth contact pad 406(N). Also, for the example configuration of FIG. 4, a wire bond element 410 may connect the first contact pad 406(1) with a contact pad 412 of the die substrate 404.

Referring back to FIG. 3, each of the memory dies 304(1)-304(N) includes a respective on-die termination (ODT) resistance circuit 314 connected to an associated I/O contact pad 312. For example, the first memory die 304(1) includes a first on-die termination resistance circuit 314(1) connected to the first I/O contact pad 312(1), the second memory die 304(2) includes a second on-die termination resistance circuit 314(2) connected to the second I/O contact pad 312(2), and the Nth memory die 304(N) includes an Nth on-die termination resistance circuit 314(N) connected to the Nth I/O contact pad 312(N).

Each of the on-die termination resistance circuits 314(1)-314(N) may have an associated on-die termination resistance. The resistance that a given on-die termination resistance circuit 314 has may be variable. That is, the resistance of a given on-die termination resistance circuit 314 may be at one of a plurality of resistance levels.

The resistance levels that each of the on-die termination resistance circuits 314 may be set to may include at least two levels, including a high resistance level and a low resistance level. In addition, for at least some example configurations, the resistance levels may include a plurality of low levels, and/or a plurality of high levels. Accordingly, at a given moment in time, a given on-die termination resistance circuit 314 may be configured to set its on-die termination resistance to one of a plurality of high resistance levels and/or to set its on-die termination resistance to one of a plurality of low resistance levels.

Additionally, a given on-die termination resistance circuit 314 may be configured to change or adjust its on-die termination resistance from a first resistance level to a second resistance level. The first and second resistance levels may be any of various combinations of high and low resistance levels. That is, depending on the configuration, the given on-die termination resistance circuit 314 may be configured to change its on-die termination resistance from a high resistance level to a low resistance level, from a low resistance level to a high resistance level, from a first high resistance level of a plurality of high resistance levels to a second high resistance level of the plurality of high resistance levels (where the first high resistance level can be either higher or lower than the second high resistance level), or from a first low resistance level of a plurality of low resistance levels to a second low resistance level of the plurality of low resistance levels (where the first low resistance level can be either higher or lower than the second low resistance level).

In general, a high resistance level is higher than a low resistance level. In some example configurations, the high resistance level, is greater than or equal to 500 Ohms (Ω) and the low resistance level is lower than or equal to 100Ω. Example high resistance levels may be 500 Ohms, 1 kΩ, or 10 kΩ. Example low resistance levels include 10 Ohms, 25 Ohms, 35 Ohms, 50 Ohms, 75 Ohms, and 100 Ohms. Other high and/or low resistance levels may be possible. In addition or alternatively, the high resistance level may be greater than or equal to ten times a characteristic impedance of the transmission line.

In addition, for some example configurations the high resistance level is a single or fixed value, and the low resistance level can be any one of a plurality of low resistance levels at any given moment in time. For such configurations, each of the low resistance levels is lower than the single high resistance level. For other example configurations, the low resistance level is a single or fixed value, and the high resistance level can be any one of a plurality of high resistance levels at any given moment in time. For such configurations, each of the high resistance levels is higher than the single low resistance levels. For still other example configurations, at any given moment in time, the high resistance level may be any one of a plurality of high resistance levels and the low resistance level may be any one of a plurality of low resistance levels. For such configurations, all of the high resistance levels are higher than all of the low resistance levels.

Also, in some example configurations, for a given ith die $304(i)$ that includes an ith on-die termination resistance circuit $314(i)$, at a given point in time, the ith on-die termination resistance circuit $314(i)$ may set its resistance level to a high resistance level that is in a range of high resistance levels that includes an upper bound high resistance level and a lower bound high resistance level, and/or may set its resistance level to a low resistance level that is in a range of low resistance levels that includes an upper bound low resistance level and a lower bound low resistance level. At any given point in time, the ith on-die termination resistance circuit $314(i)$ may set its resistance to any one of a plurality of high resistance levels in the range of high resistance levels, and/or may set its resistance level to any one of a plurality of low resistance levels in the range of low resistance levels. In addition or alternatively, the resistance levels may be discrete values or levels, and the ith on-die termination resistance circuit $314(i)$ may set its resistance level to one of the discrete resistance levels. In particular example configurations, the discrete levels may form or determine a range of high resistance levels or a range of low resistance levels. To illustrate, suppose for example that at any given moment in time, the ith on-die termination resistance circuit $314(i)$ is configured to set its resistance to a high resistance level that may be any one of a plurality of predetermined or discrete high resistance levels, including 500 Ω, 1 kΩ, or 10 kΩ. Accordingly, the resistance levels of 500 Ω, 1 kΩ, and 10 kΩ may determine a high resistance level range, where 10 kΩ is the upper bound of the range and 500 Ω is the lower bound of the range. As another illustration, suppose for example that at any given moment in time, the ith on-die termination resistance circuit $314(i)$ is configured to set its resistance to a low resistance level that may be any one of a plurality of predetermined or discrete low resistance levels, including 10 Ω, 35Ω, and 50Ω. Accordingly, the resistance levels of 10 Ω, 35Ω, and 50 Ω may determine a low resistance level range, where 50 Ω is the upper bound of the range and 10 Ω is the lower bound of the range.

For simplicity, as used hereafter and unless expressly specified otherwise, an on-die termination resistance circuit 314 being at, set to, and/or adjusted to a low level may mean that the on-die termination resistance circuit 314 is at, set to, and/or adjusted to a resistance level that is lower than the high resistance value or a lowest of a plurality of high resistance levels to which the on-die termination resistance circuit 314 may be set, which may not necessarily be an absolute low level. Similarly, an on-die termination resistance circuit 314 being at, set to, and/or adjusted to a high level may mean that the on-die termination resistance circuit 314 is at, set to, and/or adjusted to a resistance level that is higher than the low resistance value or a highest of a plurality of low resistance levels to which the on-die termination resistance circuit 314 may be set, which may not necessarily be an absolute high level.

In this context, at a given moment in time when two on-die termination circuits 314 are at a respective high resistance level, the respective high resistance levels may be the same or different high reference levels. To illustrate, suppose the two on-die termination resistance circuits 314 are both configured to be set to one of two high resistance levels—e.g., 500 Ω and 1 kΩ—at any given point in time. Accordingly, where reference is made to the two on-die termination resistance circuits 314 being at high resistance levels, the two on-die termination resistance circuits 314 may both be at 500Ω, may both be at 1 kΩ, or one resistance circuit 314 may be at 500 Ω and the other at 1 kΩ. Similarly, at a given moment in time when two on-die termination circuits 314 are at a respective low resistance level, the respective low resistance levels may be the same or different low reference levels. To illustrate, suppose the two on-die termination resistance circuits 314 are both configured to be set to one of two low resistance levels—e.g., 35 Ω and 50 Ω—at any given point in time. Accordingly, where reference is made to the two on-die termination resistance circuits 314 being at low resistance levels, the two on-die termination resistance circuits 314 may both be at 35Ω, may both be at 50Ω, or one resistance circuit 314 may be at 35 Ω and the other at 50Ω.

The resistance level that each of the on-die termination resistance circuits 314(1)-314(N) provides may be determined and/or controlled by the controller die 102 102, the plurality of memory dies 304(1)-304(N) themselves, such as by their on-die control circuits 152 (FIG. 2B), or a combination thereof. As shown in FIG. 3, each of the on-die termination resistance circuits 314(1)-314(N) may be configured to receive a respective control signal CTRL(1)-CTRL(N) that sets and/or adjusts the resistance level. For some example configurations, the controller die 102 may send a command signal to the plurality of memory dies 304 that indicates one or more resistance levels of one or more of the on-die termination circuits 314. In response, the memory dies 304 may set the on-die termination resistance circuits 314 to the resistance levels indicated by the command signal. For example, the on-die control circuits 152 may output respective control signals CTRL to respective on-die termination resistance circuits 314.

In addition, the on-die termination resistance circuits 314 may be part of or coupled to the transmission line. As previously described, the Nth memory die 304(N) may be an end die or a last die of the plurality of memory dies 304 (or of the die stack 304). Accordingly, the on-die termination resistance circuit 314(N) of the Nth memory die 304(N) may be and/or referred to as an end-die termination resistance circuit 314(N) that provides an end or termination resistance of the transmission line. The end or termination resistance provided by the Nth termination resistance circuit 314(N) may be also be referred to as a memory-side end or termination resistance, as opposed to a controller-side end or termination resistance that the controller die 102 provides.

The resistance levels to which the on-die termination resistance circuits 314 are set may affect the transmission efficiency and/or signal quality of a signal communicated on the transmission line. During a time period that a signal is being communicated on the transmission line, the memory dies 304 may be configured to set their respective on-die termination resistance circuits 314 to certain combinations of high and low resistance levels in ways and/or according to configurations that optimize for transmission efficiency and/or signal quality (compared to other combinations of high and low resistance levels), such as by providing a combination of high and low resistance levels that maximizes the bandwidth, frequency, and/or transmission rate of the signal, minimizes attenuation of the signal component of the signal, and/or minimizes energy reflections of the signal propagating in the transmission line, which may have the effect of maximizing signal-to-noise ratio (SNR) and/or minimizing distortion in the signal, such as jitter or duty cycle distortion, as examples.

A given combination of high and low resistance levels to which the N-number of on-die termination resistance circuits 314(1) to 314(N) may be set during a given communication of a signal on the transmission line may depend on whether the controller die 102 is transmitting the signal on the transmission line to a kth target memory die 304(k) or the kth target memory die 304(k) is transmitting the signal to the controller die 102, and which of the N-number of memory dies 304(1) to 304(N) is the kth target memory die 304(k). For situations where the controller die 102 is transmitting the signal to the memory dies 304, the kth target memory die 304(k) is the one of the N-number of dies 304(1) to 304(N) that the controller die 102 wants to receive the signal. For example, for a given program operation, the controller die 102 may transmit a clock signal, a data signal, or a command signal on the transmission line with the intention that the kth target memory die 304(k) receive the signal in order to have the kth target memory die 304(k) program data into its memory cells. As another example, for a given read operation, the controller die 102 may transmit a clock signal or a command signal on the transmission line with the intention that the kth target memory die 304(k) receive the signal in order to have kth target memory die 304(k) send data that the kth target memory die 304(k) is storing back to the controller die 102. In addition, for situations where the plurality of memory dies 304, such as in the form of a die stack, is transmitting the signal to the controller die 102, the kth target memory die 304(k) is the one of the plurality of memory dies 304 that is transmitting the signal. For example, during a given program operation, the kth target memory die 304(k) may be the one of the plurality of memory dies 304 that transmits a status signal on the transmission line to the controller die 102 that indicates whether the kth target memory die 304(k) has finished programming data associated with the program operation. As another example, for a given read operation, the kth target memory 304(k) may be the one of the plurality of memory dies 304 that transmits a data signal or a clock signal on the transmission line to the controller die 102.

For either situation, where the controller die 102 is transmitting the signal on the transmission line to the memory dies 304 or the kth target memory die 304(k) is transmitting the signal on the transmission line to the controller die 102, whether it be for a read operation or a write operation, the transmission of the signal on the transmission line may be dependent on the end memory die (i.e., the Nth memory die) 304(N) of the plurality of dies 304, having set its end-die termination resistance to a low resistance level. The transmission of the signal is dependent on the end memory die 304(N) setting its end-die termination resistance circuit 314(N) to the low resistance level in that the memory system 100 is configured to ensure that the end memory die 304(N) sets its end-die termination resistance circuit 314(N) coupled to the transmission to the low resistance level in order for the transmission of the signal on the transmission line to occur. Otherwise stated, the memory system 100 may be configured to control the end die 304(N) to set its end-die termination resistance circuit 314(N) to the low resistance level in such a way so that the end die 304(N) does not have its end-die termination resistance circuit 314(N) set to the high resistance level at the time of or during the transmission of the signal on the transmission line.

The memory system 100 may be configured to have the end die 304(N) set its end-die termination resistance circuit 314(N) to the low resistance level in any of various ways. For some example configuration, the memory system 100 may be configured to have the end die 304(N) set its on-die termination resistance circuit 314(N) to the low resistance level upon start up, such as part of a boot sequence, a power up sequence, or an initialization sequence. Once set at the low resistance level, the end die 304(N) may keep or maintain the end-die termination resistance circuit 314(N) at the low resistance level during the course of operation of the memory system 100, such as during the course of memory operations (e.g., read, program, and erase operations), until an event, such as a power down event, occurs.

In other example configurations, the memory system 100 may be configured to have the end die 304(N) set its on-die termination resistance circuit 314(N) to the low resistance level when the controller die 102 determines it wants to communicate with the plurality of memory dies 304 (e.g., it wants to communicate with the die stack). As previously described, the memory dies 304 within the memory system 100 may be organized into a plurality of groups, such as a plurality of chip enable groups. The N-number of memory dies 304(1) to 304(N) in FIG. 3 may represent memory dies of one group. During a given time period when the controller die 102 does not want to communicate with any of the dies of a given group, each of the dies of the given group may set their respective on-die termination resistance circuits to a high resistance level. Alternatively, when the controller die 102 wants to communicate with a particular group, the controller die 102 wants to communicate with a kth target die 304(k) of a group, such as because the controller die 102 wants to send data to or read data from the kth target die 304(k), before the data communication occurs, the controller die 102 may notify the group of dies that it wants to communicate with kth target die 304(k), such as by sending an initial command signal. The initial command signal may be a chip enable signal, for example. In response to receipt of the initial command signal, the end die 304(N) may adjust its end-die termination resistance circuit 314(N) from the high resistance level to the low resistance level, or otherwise confirm that the end-die resistance level is set to the low resistance level. This way when a subsequent signal, such as a clock signal or a data signal, is communicated on the transmission line, the end-die termination resistance circuit 314(N) is set to the low resistance level during the communication.

The end-die termination resistance circuit 314(N) may be set to the low resistance level during the transmission of the signal on the transmission line in order to have better impedance match between the memory-side end-die termination resistance and the characteristic impedance of the transmission line. In general, when the controller die 102 transmits the signal on the transmission line, the signal may propagate to the end of the transmission line on the memory side, e.g., to the end die 304(N) and/or to the end I/O contact pad portion 312(N). In addition, when the kth target memory die 304(k) transmits the signal, such as at or from the output pad of the kth I/O contact pad portion 312(k), the signal (e.g., its energy or amplitude of the signal) will want to split, with a first portion of the signal propagating toward the controller die 102 (e.g., toward the controller-side end or termination of the transmission line) and a second portion of the signal propagating toward the end die 304(N) (e.g., toward the memory-side end or termination of the transmission line). For the second portion of the signal propagating toward the end die 304(N), the closer the end-die termination resistance is to the characteristic impedance of the transmission line, the smaller the amount of reflections (e.g., energy reflections) that occur on the transmission, and the smaller the amount of reflections, the lower the amount of noise or distortion in the signal that is generated during transmission.

The low resistance level may be closer to the characteristic impedance of the transmission line compared to the high resistance level. Accordingly, having the end die 304(N) set its end-die termination resistance circuit 314(N) to the low resistance level during communication of the signal may optimize for transmission efficiency and/or signal quality.

In some example configurations, the transmission of the signal on the transmission line, whether the controller die 102 is transmitting the signal or the kth target memory die 304(k) is transmitting the signal, is also dependent on one or more memory dies 304 other than the end die 304(N) having set its/their respective on-die termination resistance circuit(s) 314 to the low resistance level. One reason one or more other dies 304 may also set its/their respective termination resistance circuit(s) 314 to the low resistance level is to set an effective or total memory-side end or termination resistance closer to the characteristic impedance of the transmission line compared to if only the end die 304(N) sets its on-die termination resistance circuit 314(N) to the low level, which in turn may allow for further or more enhanced optimization of transmission efficiency and/or signal quality.

In further detail, in situations where the controller die 102 transmits a signal on the transmission line to the N-number of memory dies 304(1) to 304(N), the N-number of memory dies 304(1) to 304(N) as a whole may provide a total or effective memory-side termination resistance of the transmission line that is determined by a combination of the resistance levels of the N-number of on-die termination resistance circuits 314(1) to 314(N). In particular, the total or effective memory-side termination resistance may be equal or correspond to a parallel combination of the resistance levels. Those on-die termination resistance circuits 314 set to the low resistance level may predominantly impact or affect the resistance level of the effective memory-side termination resistance, while those on-die termination resistance circuit 314 set to the high resistance level may minimally impact or affect the resistance level of the effective memory-side end-die termination resistance. In some example configurations, the total or effective memory dies 304(1) to 304(N) (or die stack) may be configured to have or provide a total or effective memory-side termination resistance that is within a range of resistance levels defined by plus-or-minus a given percentage (e.g., 20% or 10%) of the characteristic impedance of the transmission line. Otherwise stated, the total or effective memory-side termination resistance that the memory dies 304 (or die stack) provides may be the characteristic impedance of the transmission line plus-or-minus a given percentage (e.g., 20% or 10%) of the characteristic impedance.

In addition, in situations where the kth target memory die 304(k) transmits a signal on the transmission line, the total or effective memory-side termination resistance of the transmission line may be determined by a parallel combination of the resistance levels of the (k+1)th to Nth on-die termination resistance 314(k+1) to 314(N) of the (k+1)th to Nth memory dies 304(k+1) to 304(N) positioned further away from the controller die 102 than the kth target memory die 304(k).

In some example configurations, a lowest low resistance level that the end die 304(N) can set its end-die termination resistance circuit 314(N) to may be greater than the characteristic impedance of the transmission line. In view of the parallel combinations, by setting one or more other on-die termination resistance circuit 314 to low resistance levels, the parallel combination of resistance levels that includes two or more on-die resistance circuits 314 set to the low resistance level while the other on-die resistance circuits 314 are set to the high resistance level may provide a total or effective memory-side termination resistance that is closer to the characteristic impedance of the transmission line compared to if only the end-die termination resistance circuit 314(N) is set to the low resistance level.

In general, the N-number of memory dies 304(1) to 304(N) may include an M-number of one or more effective end or termination memory dies 304, where M is one or more. For example configurations where M is one, the effective end memory die 304 includes only the (actual) end die 304(N). For other example configurations where M is two or more, the M-number of effective end memory dies 304 may include the actual end die 304(N) and an (M−1)-number of other memory dies 304. In particular example configurations where M is two or more, the M-number of memory dies 304 are each adjacent to at least one other memory die that is part of the M-number of effective end memory dies. Accordingly, under the numbering scheme of FIG. 3, the M-number of effective end memory dies includes dies 304 (N−(M−1)) to 304(N) respectively including on-die termination circuits 314(N−(M−1)) to 314(N). Similar to the Nth die 304(N) being the referred to as the end die 304(N), the (N−1)th die may be referred to as the second-to-end die 304(N−1), the (N−2)th die may be referred to as the third-to-end die 304(N−2), and so on.

Accordingly, for configurations that include an M-number of effective end dies 304(N−(M−1)) to 304(N) where M is two or more, the transmission of the signal on the transmission line may be dependent on the end die 304(1) having set the end-die termination resistance circuit 314(N) to the low resistance level, and further dependent on the (N−(M−1))th to (N−1)th on-die termination resistance circuit(s) having set its/their respective on-die termination resistance circuit(s) 314(N−(M−1)) to 314(N−1) to the low resistance level. To illustrate, suppose M is 2. The transmission of the signal on the transmission line, whether the controller die 102 is transmitting the signal or the kth target memory die 304(k) is transmitting the signal, the memory system 100 may ensure that both the end die 304(N) sets its end-die termination resistance circuit 314(N) to the low resistance level, and the second-to-end die 304(N) sets its end-die termination resistance circuit 314(N) to the low resistance level. The memory system 100 may ensure that the M-number of effective end dies 304(N−(M−1)) to 304(N) set their respective effective end-die termination resistance circuits 314(N−(M−1)) to 314(N) to respective low resistance levels in the same way that it ensures that the end die 304(N) sets its end-die termination resistance circuit 314(N) to the low resistance level, as previously described.

In addition, for configurations that include an M-number of effective end dies 304(N−(M−1)) to 304(N) where M is two or more, the low resistance levels to which each of the M-number of effective dies 304(N−(M−1)) to 304(N) may be the same or different from each other. To illustrate, suppose M is 2 and the end die 304(N) and the second-to-end die 304(N−1) may each be configured to set their on-die termination resistance circuits 314(N), 314(N−1) to either a first low resistance level of 35 Ω or a second low resistance level of 50Ω. Accordingly, during a given transmission of a signal on the transmission line, the end and second-to-end dies 304(N), 304(N−1) may both set their respective on-die termination resistance circuits 314(N), 314(N−1) to the first low resistance level of 35Ω, may both set their respective on-die termination resistance circuits 314(N), 314(N−1) to the second low resistance level of 50Ω, or one of the dies may set its on-die termination resistance circuit to the first low resistance level of 35 Ω and the other die may set its on-die termination resistance circuit to the second low resistance level of 50Ω. The ability to set multiple on-die termination resistance circuits each to one of a plurality of low resistance levels may provide greater flexibility or more possible parallel combinations of low resistance levels, which in turn provides a greater number of possible resistance levels that the memory dies 304 can set for the memory-side termination resistance of the transmission line. This, in turn, provides the memory dies 304 with the ability to provide an effective memory-side termination resistance that more closely matches a wider range of different characteristic impedance values of the transmission line.

In addition, for a transmission of a signal on the transmission, the kth target memory die 304(k) may be configured to set its kth on-die termination resistance circuit 314(k) to a resistance level (e.g., to a high resistance level or to a low resistance level) based or dependent on whether the controller die 102 is transmitting the signal and the kth target memory die 304(k) is receiving the signal, or the kth target memory die 304(k) is transmitting the signal and the controller die 102 is receiving the signal. In particular, when the controller die 102 is transmitting the signal and the kth target memory die 304(k) is receiving the signal, the kth target memory die 304(k) may set its kth on-die termination resistance circuit 314(k) to a high resistance level. Accordingly, when the controller die 102 is transmitting the signal on the transmission line, the transmission is dependent on the kth target memory die 304(k) setting the kth on-die termination resistance circuit 314(k) to the high resistance level. The transmission is dependent on the kth target memory die 304(k) setting the kth on-die termination resistance circuit 314(k) to the high resistance level in that the memory system 100 may ensure that the kth target memory die 304(k) sets its on-die termination resistance circuit 314(k) to the high resistance level for the transmission of the signal. For example, when the controller die 102 determines that it wants to communicate with the kth target memory die 304(k), the controller die 102 may send a command signal, such as a chip enable signal, to the memory dies 304 (e.g. the memory die stack), and the kth target memory die 304(k) may respond by setting its kth termination resistance circuit 314(k) coupled to the transmission line to a high resistance level. In turn, the controller die 102 may then send a signal, such as a clock signal, a data signal or a command signal, on the transmission line coupled to the kth termination resistance circuit 314(k) set to the high resistance level. Other ways of configuring the memory system 100 to ensure that the kth target memory die 304(k) sets the kth on-die termination resistance circuit 314(k) to the high resistance level when or in response to the controller die 102 wanting to transmit a signal on the transmission line to the kth target memory die 304(k) may be possible.

Setting the kth target memory die 304(k) to the high resistance level when the controller die 102 transmits the signal on the transmission line may keep the effective or total memory-side termination resistance optimally matched to the characteristic impedance of the transmission line. As previously described, the effective or total memory-side termination resistance may depend on a parallel combination of the high and low resistance levels of the on-die termination resistance circuits 314. As such, if the kth target memory die 304(k) were to set the kth on-die termination resistance circuit 314(k) to the low resistance level, the effective memory-side termination resistance may decrease such that level of the effective memory-side termination resistance would be further away from the characteristic impedance of the transmission line. Accordingly, the kth target memory die 304 setting the kth on-die termination resistance circuit 314(k) to the high resistance level when the controller die 102 wants to transmit a signal on the transmission line may provide an effective memory-side termination resistance that more closely matches the characteristic impedance of the transmission line—given that the end die 304(N) or the effective end dies 304(N−(M−1)) to 304(N) has/have set its/their on-die termination resistance circuit(s) 314 to the low resistance level.

On the other hand, when the kth target memory die 304(k) is to transmit a signal on the transmission line, the kth target memory die 304(k) may be configured to set the kth on-die termination resistance circuit 314(k) to a low resistance level. Otherwise stated, the kth target memory die 304(k) may be configured to transmit a signal on the transmission line, where the transmission is dependent on the kth target on-die termination resistance circuit 314(k) set to the low resistance level. The transmission is dependent on the kth target memory die 304(k) setting the kth on-die termination resistance circuit 314(k) to the low resistance level in that the memory system 100 may ensure that the kth target memory die 304(k) sets its on-die termination resistance circuit 314(k) to the low resistance level for the transmission of the signal. For example, in situations where the kth target memory die 304(k) determines that it is to send a signal on the transmission line to the controller die 102, the kth target memory die 304(k) may first be configured to check if the kth on-die termination resistance circuit 314(k) is set to the low resistance level before sending the signal. Upon setting or confirming that the kth on-die termination circuit 314(k) is set to the low resistance level, the kth target memory die 304(k) may transmit the signal onto the transmission line.

Various ways of configuring the memory system 100 to ensure that the kth target memory die 304(k) sets the kth on-die termination resistance circuit 314(k) to the low level may be possible. For example, when the controller die 102 determines that it wants to communicate with the kth target memory die 304(k), the controller die 102 may send a command signal, such as a chip enable signal, to the memory dies 304 (e.g. the memory die stack), and the kth target memory die 304(k) may respond by setting a kth on-die termination resistance circuit 314(k) coupled to a transmission line onto which it is to transmit a signal to the controller die 102 to a low resistance level. To illustrate, suppose the controller die 102 wants to certain read data or a certain data set from the kth target memory die 304(k). In turn, the controller die 102 may send one or more read command signals to the memory dies 304 (e.g., the die stack), indicating that the controller die 102 wants to read the certain data from the kth target memory die 304(k). To comply with the command, the kth target memory die 304(k) will transmit a data signal carrying at least some of the certain data on a certain transmission line. Before transmitting the data signal, the kth target memory die 304(k) may set the kth on-die termination resistance circuit 314(k) that is coupled to that transmission line to the low resistance level.

In at least some example configurations where the kth target memory die 304(k) is transmitting the signal to the controller die 102, the low resistance level to which the kth target memory die 304(k) sets the kth target on-die termination resistance 314(k) may be lower than the characteristic impedance of the transmission line. In particular example configurations, the resistance level of the kth target on-die termination resistance 314(k) is at least 50% lower than the characteristic impedance of the transmission line. For at least some of these example configurations, the low resistance level of the kth on-die termination resistance 314(k) is lower than the low resistance level of the end die 304(N) or all or at least some of the M-number of effective end dies 304(N−(M−1)) to 304(N). For example, the low resistance level of the kth target on-die termination resistance 314(k) may be 10Ω, while the low level of the end-die termination resistance 314(N) may be 35 Ω or 50Ω.

In general, when the kth target memory die 304(k) is transmitting the signal onto the transmission line, the lower the resistance level of the kth target on-die termination resistance circuit 314(k), the less then kth target on-die termination resistance circuit 314(k) may attenuate the amplitude (or magnitude) of the signal, which in turn may allow for greater efficiency of the signal transmission since the signal may be transmitted to the controller die 102 with greater power and/or the signal may have a higher signal-to-noise ratio.

Exceptions may occur when the kth target memory die 304(k) is the end die 304(N) or one of the effective end dies 304(N−(M−1)) to 304(N). For example, in a situation where the controller die 102 wants to transmit a signal on the transmission line and further wants the end die 304(N) to receive the signal—meaning that the end die 304(N) and the kth target die 304(k) are the same—the end die 304(N), even though it is the kth target die 304(k), may set its end-die termination resistance circuit 314(N) to the low resistance level instead of to the high resistance level. Similarly, when the controller die 102 wants to transmit a signal on the transmission line to one of the effective end dies 304(N−(M−1) to 304(N−1) other than the actual end die 304(N)— meaning that one of the effective end dies 304(N−(M−1)) to 304(N−1) other than the end die 304(N) is the kth target memory die 304(k)—that die may set its on-die termination resistance circuit to the low resistance level instead of the high resistance level.

Additionally, for situations where the kth target memory die 304(k) is to transmit a signal on the transmission line, and for configurations where the kth target memory die 304(k) is configured to set the kth target on-die termination resistance 314(k) to a first low resistance level that is lower than a second low resistance level to which the end die 304(N) or the effective end dies 304(N−(M−1)) to 304(N) are to set its/their end-die termination resistance circuits 314, where the end die 304(N) or one of the effective end dies 304(N−(M−1)) to 304(N) is the kth target die 304(k), the end die 304(N) or the one of the effective end dies 304(N−(M−1)) to 304(N), as the kth target die 304(k), may set its on-die termination resistance circuit 314 to the second low resistance level instead of the first, lower resistance level.

Also, in some example configurations, either for situations where the controller die 102 is to transmit a signal on a transmission line to the kth target memory die 304(k), or for situations where the kth target memory die 304(k) is to transmit a signal on a transmission line to the controller die 102, the transmission may be dependent on remaining dies of the N-number of dies 304(1) to 304(N)—i.e., those dies other than the kth target memory die 304(k) and the one or more effective end dies 304(N−(M−1)) to 304(N−1)—having set their respective on-die termination resistance circuits to associated high resistance levels. The memory system 100 may be configured to ensure that the remaining dies 304 set their respective on-die termination resistance circuits to associated high resistance levels in various ways. For some example configurations, the high resistance level may be a default resistance level to which the on-die termination circuits are set. For a given transmission on a transmission line, as long as a given ith die 304(i) is not one of the effective end dies 304(N−(M−1) to 304(N) or is not a kth target die 304(k) that is transmitting the signal on the transmission line, the given ith die 304(i) is configured to set and/or maintain its ith on-die termination resistance circuit 314(i) that is coupled to the transmission line to the high resistance level.

Additionally, as previously mentioned, the controller die 102 may provide a controller-side end or termination resistance for the transmission line. The controller die 102 may provide the controller side termination resistance by setting its own on-die termination resistance circuit (not shown in FIG. 3) to a low resistance level. An effective controller-side termination resistance set by the controller die's 102 on-die termination resistance circuit may match the characteristic impedance of the transmission line as close as possible, and in some cases within a range of plus-or-minus 20% of the characteristic impedance. The controller die 102 may be configured to set its on-die termination resistance circuit to the low resistance level for both when the controller die 102 transmits a signal to the dies 304, and when the kth target memory die 304(k) transmits a signal to the controller die 102. In this context, for at least some example configurations, a transmission of a signal from the controller die 102 on the transmission line to the memory dies 304 may be dependent on the controller die 102 having set its on-die termination resistance circuit to the low resistance level. Similarly, a transmission of a signal from a kth target memory die 304(k) on the transmission line to the controller die 102 may be dependent on the controller die 102 having set its on-die termination resistance circuit to the low resistance level.

In an example operation, the controller die 102 may have received a host command from a host device indicating to the controller die 102 to perform a memory operation on or with the kth target memory die 304. The memory operation may be a write (program) operation or a read operation, as examples. In response to receipt of the host command, the controller die 102 may perform necessary actions, such as by sending a command to the dies 304, to notify the dies 304 that it wants to communicate with the kth target die 304(k) for performance of the memory operation. If not already, the end die 304(N) or the M-number of effective end dies 304(N–(M–1)) may set its/their on-die termination resistances to a low resistance level.

For performance of the memory operation, the controller die 102 may output one or more signals on one or more transmission lines for receipt by the kth target memory die 304(k), and the kth target memory die 304(k) may output one or more signals on one or more other transmission lines for completion of the memory operation. For example, where the controller die 102 receives a host read command, the controller die 102 may output a clock signal on a clock transmission line to the memory dies 304. In response, the kth target memory die 304(k) may use the clock signal to generate one or more data signals, and output another clock signal and the one or more data signals on a plurality of transmission lines back to the controller die 102 for completion of the read operation. As another example, where the controller die 102 receives a host write command, the controller die 102 may output a clock signal and one or more data signals on a plurality of transmission lines to the memory dies 304. In response, the kth target memory die 304 may use the clock signal to program data carried by the one or more data signals into its memory cells. Upon completing or as part of the program operation, the kth target memory die 304(k) may output one or more status signals back to the controller die 102 to provide a status of the program operation, such as whether the program was successful, it is still going, or the program was unsuccessful.

In addition to the end die 304(N) or the effective end dies 304(N–(M–1)) setting their on-die termination resistance circuits to low resistance levels for performance of the memory operation, the kth target memory die 304 may set its on-die termination resistance circuits 314(k) coupled to one or more transmission lines configured to receive one or more signals from the controller die 102 for performance of the memory operation to a high resistance level, and may set its on-die termination resistance circuits 314(k) coupled to one or more transmission lines on which it is configured to output one or more signals for performance of the memory operation to a low resistance level, such as a lowest resistance level or a resistance level lower than a characteristic impedance of the transmission line, as previously described.

Figure 5:
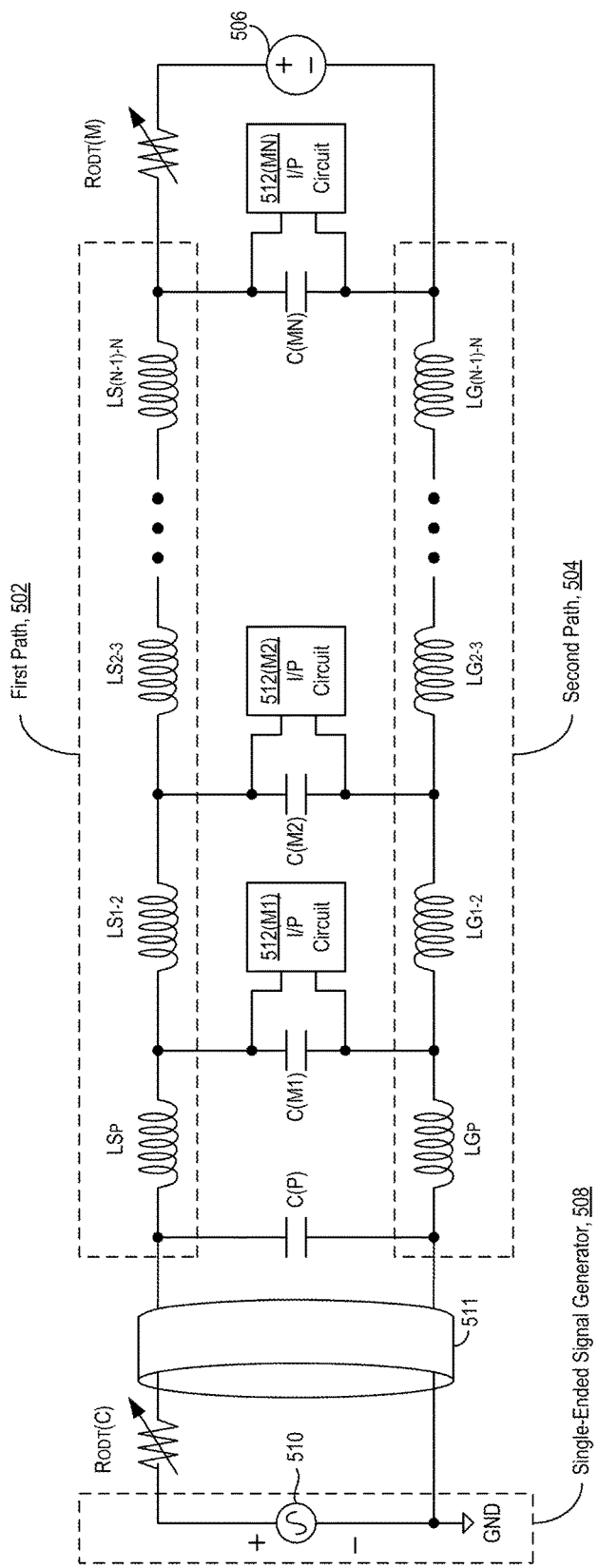
FIG. 5 is a partial circuit schematic of a circuit model of a single-ended transmission line, where a controller die transmits a single-ended signal to the N-number of dies of FIG. 3.
Figure 6:
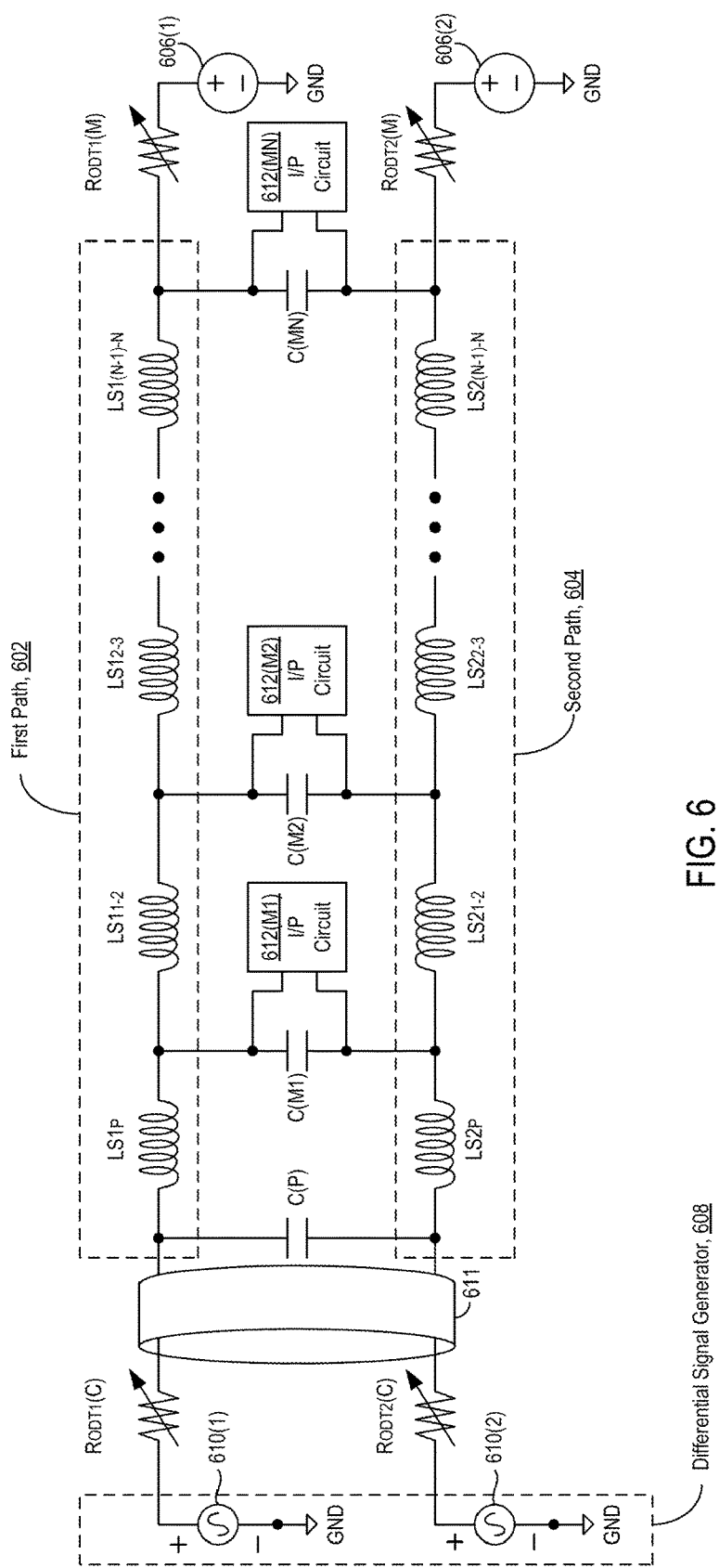
FIG. 6 is a partial circuit schematic of a circuit model of a differential transmission line, where the controller die transmits a differential signal to the N-number of dies of FIG. 3.
Figure 7:
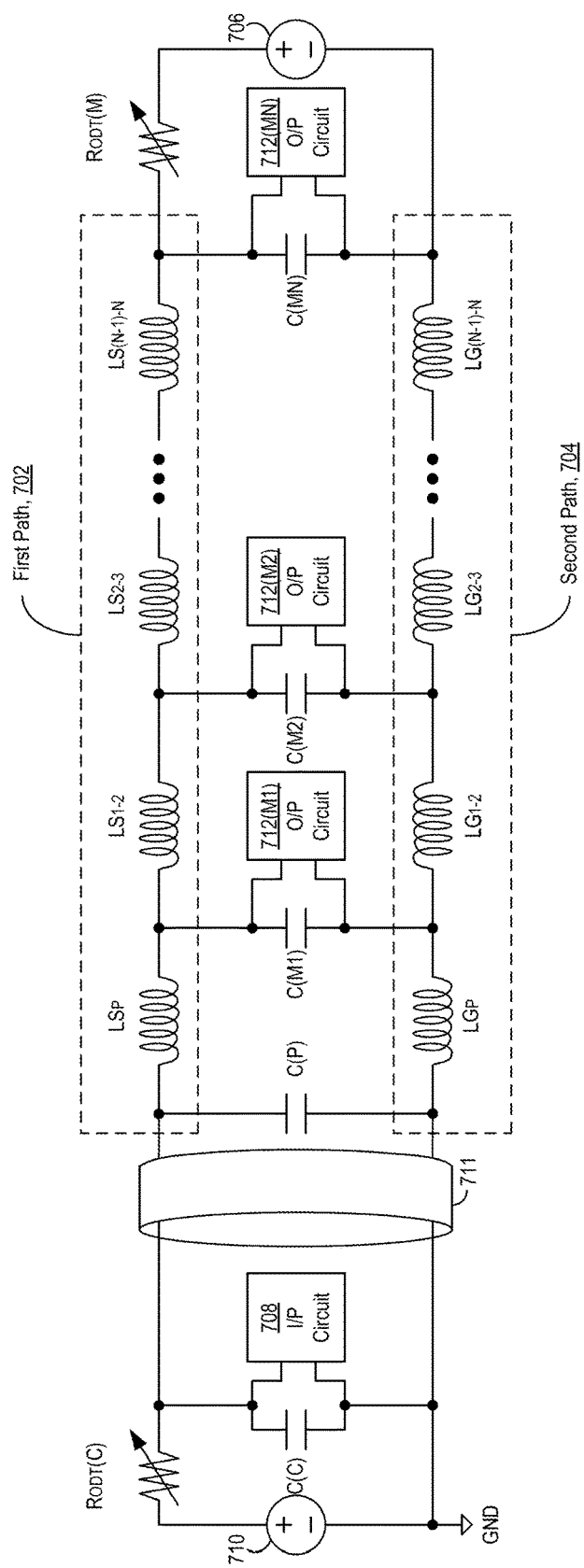
FIG. 7 is a partial circuit schematic of a circuit model of a single-ended transmission line, where a target memory die of the N-number of dies of FIG. 3 transmits a single-ended signal to the controller die.
Figure 8:
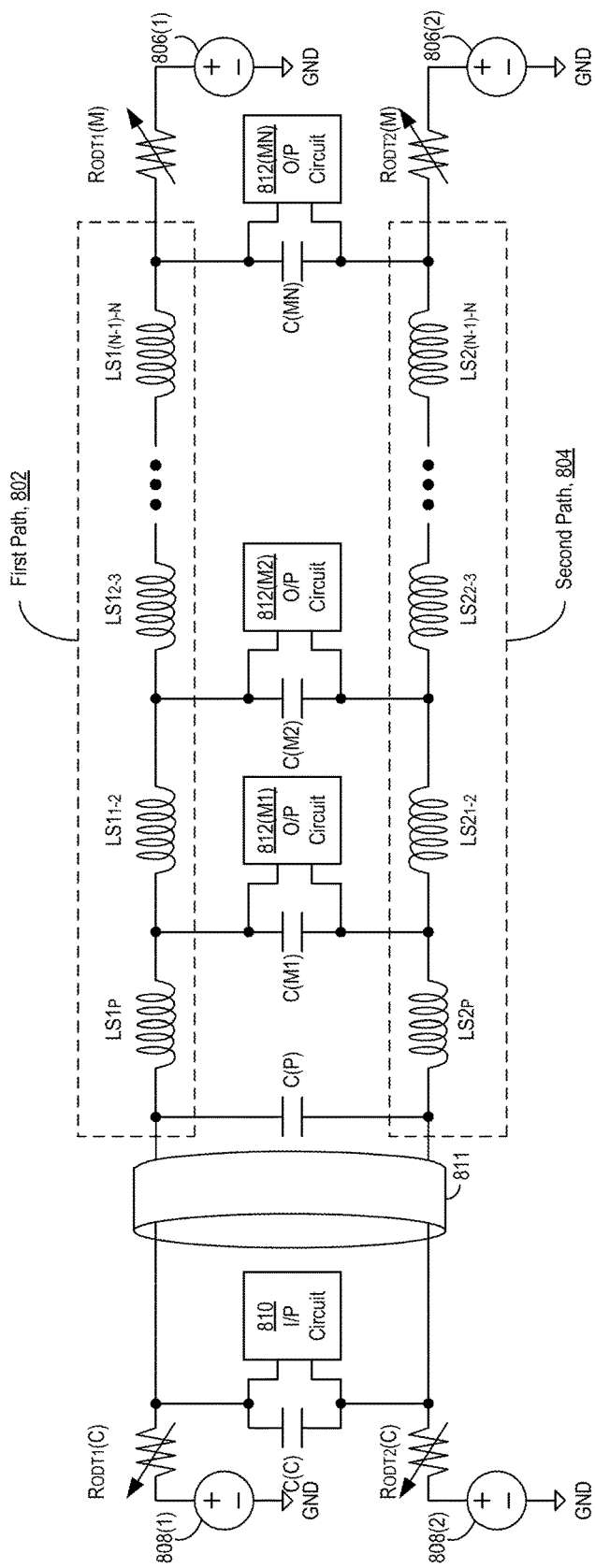
FIG. 8 is a partial circuit schematic of a circuit model of a differential transmission line, where a target memory die of the N-number of dies of FIG. 3 transmits a differential signal to the controller die.

FIG. 5-8 are partial circuit schematic diagrams of circuit models of the transmission line between the controller die 102 and the plurality of memory dies 304 of FIG. 3. FIGS. 5 and 6 show circuit models for when the controller die 102 is transmitting the signal on the transmission line. FIGS. 7 and 8 show circuit models for when a kth target memory die 104(k) is transmitting the signal on the transmission line. Additionally, FIGS. 5 and 7 show circuit models of the transmission line configured as a single-ended transmission line. FIGS. 6 and 8 show circuit models of the transmission line configured as a differential transmission line.

Referring particularly to FIG. 5 (and also back to FIGS. 3 and 4), the circuit model includes two paths of the transmission line, including a first path 502 and a second path 504. The first path 502 may be the signal path and the second path 504 may be the ground path of the single-ended transmission line. In general, the conductive elements of the paths may be represented by or modeled as inductors or inductive elements that provide an inductance to the transmission line. The inductive elements of the first, signal path 502 are represented by inductors LS, and the inductive elements in the second, ground path 504 are represented by inductors LG. The transmission line model may also include capacitors C to represent capacitive elements of or coupled to the transmission line. The capacitive elements may include the substrates in which the conductive/inductive elements are disposed or coupled to, such as the substrates of the memory dies 304, the die substrate 404, or circuit parasitic loading, as examples. In general, the inductive elements LS or LG of a given path are connected in series with each other, and are connected in shunt with the capacitive elements C. In simpler models, the inductance of the ground path 504 may be "folded" into the inductance of the signal path 502.

In the signal path, the inductance provided by the first PCB and packaging portions 306_1, 308_1 may be represented by inductor LSp; an inductance provided by the first wire bond element 310(1) and (optionally) by the I/O contact pads of the first and second I/O contact pad portions 312(1) and/or 312(2) that are part of the first path may be represented by inductor $LS_{1-2}$; an inductance provided by the second wire bond element 310(1) and (optionally) by the I/O contact pads of the second and/or third I/O contact pad portions 312(2), 312(3) that are part of the first path may be represented by inductor $LS_{2-3}$; and extend to an inductance provided by the (N–1)th wire bond element 310(N–1) and (optionally) by the I/O contact pads of the (N–1)th and/or Nth I/O contact pad portions 312(N–1), 312(N) that are part of the first path may be represented by inductor $LS_{(N-1)-N}$. The inductive components of the second, ground path 504 may be similarly represented by inductors LGp, $LG_{1-2}$, $LG_{2-3}$, and extend to $LG_{(N-1)-N}$.

The circuit model of the single-ended transmission path may further include a capacitor C(P), which may represent capacitance provided by capacitive elements over which the inductive packaging portions 306, 308 extend, such the die substrate 404. The circuit model may also include capacitors C(M1), C(M2), and extending to C(MN) connected in shunt with the signal and ground paths 502, 503. The capacitors C(M1), C(M2), and extending to C(MN) may represent the capacitance provided by the die substrates of the first memory die 304(1), the second memory die 304(2), and extending to the Nth memory die 304(N), respectively.

Also, as shown in FIG. 5, a total or effective termination resistance as provided by the on-die termination circuits 314 may be represented by a memory-side ODT resistor $R_{ODT}$(M). Also, in FIG. 5, a voltage source 506 may be included to represent a voltage offset for the termination to accommodate a voltage offset of a data signal source 510. For example, if the data signal source 510 signal amplitude is between ground (GND) and a power supply voltage, then the termination voltage source is at the power supply voltage. Other examples include near-ground signaling, where, the signal source 510 signal voltages are near GND, in which the voltage source would then be zero, GND level.

The circuit model may further include a single-ended signal generator 508, which may represent the circuitry of the controller die 102 that generates the signal transmitted on the single-ended transmission line. As shown in FIG. 5, the single-ended signal generator 508 may include the data signal source 510 configured to generate the signal. An example configuration of the data signal source 510 may be a step digital signal source, although other configurations may be possible. The data signal source 510 may include a first, positive terminal coupled to the signal path 502, and a second, negative terminal coupled to the ground path 504. Also, as shown in FIG. 5, the positive terminal may be coupled to the signal path 502 by way of a controller-side resistor $R_{ODT}$(C), which may represent the controller-side termination resistance that the controller die 102 provides for the single-ended transmission line.

For completion, the circuit model of FIG. 5 also includes an example single-ended transmission line 511 connecting the controller die 102 to the plurality of memory dies 304. The transmission line 511 in combination with the inductive and capacitive transmission line elements of the memory dies 304 shown in FIG. 5 may represent a complete single-ended transmission line between the controller die 102 and the memory dies 304.

Also, as shown in FIG. 5, the circuit model of the transmission line coupled to a plurality of input (I/P) circuits 512, including a first input circuit 512(M1), a second input circuit 512(M2), and extending to an Nth input circuit 512(MN). Each input circuit 512 may be a component of respective I/O driver circuitry 158 (FIG. 2B). In particular example configurations, the input circuits 512 are configured as buffer circuits, although other configurations may be possible. Additionally, each input circuit 512 may be an input circuit of a respective one of the memory dies 304 configured to receive the signal transmitted from the controller die 102. So, for example, the first input circuit 512(M1) may represent an input circuit of the first die 304(1), the second input circuit 512(M2) may represent an input circuit of the second die 304(2), and the Nth input circuit 512(MN) may represent an input circuit of the Nth die 304(N). In the circuit model, each ith input circuit 512($i$) is coupled to a respective ith capacitor C(Mi), and includes a first input terminal coupled to a first end of ith capacitor C(Mi) and to the signal path 502, and a second input terminal coupled to a second end of the ith capacitor C(Mi) and to the ground path 504.

Referring particularly to FIG. 6, the differential circuit model may be similar to the single-ended circuit model of FIG. 5, except that first and second paths 602, 604 my both be signal paths, each configured to propagate a respective signal component of the differential signal. Inductive elements of the first signal path 602 are labeled LS1 and inductive elements of the second signal path 604 are labeled LS2. As a differential transmission line, the first signal path 602 may be terminated with a first memory-side termination resistance $R_{ODT1}$(M) connected to a first voltage source 606(1) to represent a voltage offset for the termination to accommodate a voltage offset of a first data signal source 610(1). Similarly, the second signal path 604 may be terminated with a second memory-side termination resistance $R_{ODT2}$(M) connected to a second voltage source 606(2) to represent a voltage offset for the termination to accommodate a voltage offset of a second data signal source 610(2).

The circuit model may further include a differential signal generator 608, which may represent the circuitry of the controller die 102 that generates the signal transmitted on the differential transmission line. As shown in FIG. 6, the differential signal generator 608 may include the first data signal source 610(1) configured to generate a first signal component of the differential signal. The first data signal source 610(1) may be coupled to the first signal path 602 by way of a first controller-side termination resistance $R_{ODT2}$(C) of the controller die 102. In addition, the differential signal generator 608 may include a second data signal source 610(2) configured to generate a second signal component of the differential signal. The second data signal source 610(2) may be coupled to the second signal path 602 by way of a second controller-side termination resistance $R_{ODT2}$(C) of the controller die 102. In some example configurations, the first and second data signal sources 610(1), 610(2) may be step digital signal sources, although other example configurations may be possible.

For completion, the circuit model of FIG. 6 also includes an example differential transmission line 611 connecting the controller die 102 to the plurality of memory dies 304. The transmission line 611 in combination with the inductive and capacitive transmission line elements of the memory dies 304 shown in FIG. 6 may represent a complete differential transmission line between the controller die 102 and the memory dies 304.

In addition, similar to the single-ended circuit model, the differential transmission line may be coupled to a plurality of input circuits 612, each representing an input circuit, such as an input buffer of a respective one of the memory dies 304, and configured to receive a differential signal transmitted from the differential signal generator 608. Each ith input circuit 612(Mi) may include a first input terminal coupled to a first end of a respective ith capacitor C(Mi) and the first signal path 602, and a second input terminal coupled to a second end of the ith capacitor C(Mi) and the second signal path 604.

Referring to FIG. 7, the single-ended circuit model of the transmission line is similar to the single-ended circuit model of the transmission line of FIG. 5, except that a kth die 304($k$) is transmitting a signal on the transmission line instead of the controller die 102. Similar to the single-ended circuit model of FIG. 5, the transmission line model of FIG. 7 includes a first path 702, which may be a signal path of the single-ended transmission line, and a second path 704, which may be a ground path of the single-ended transmission line. Like the model of FIG. 5, the inductive components of the signal path 702 are labeled LS and the inductive components of the ground path 704 are labeled LG. As mentioned for FIG. 5, simpler models may "fold" the inductive components LG of the ground path 704 into the signal path 702. Also, the capacitive components of the memory dies 304 C(M1), C(M2), and extending to C(MN) are connected in shunt with the signal and ground paths 702, 704. In addition, as shown in FIG. 7, the signal and ground paths 702, 704 are terminated with a memory-side termination resistance $R_{ODT}$(M) provided by the on-die termination resistance circuits 314 of the memory dies 304. The memory-side termination resistance $R_{ODT}$(M) may be connected to a voltage source 706 to represent a voltage offset for the termination to accommodate a voltage offset of a data signal source of the kth die 304($k$) transmitting the signal.

In FIG. 7, since a kth target die 304($k$) is transmitting, the controller die 102 is receiving, and so the model includes the controller die 102 as including an input circuit 708, such as an input buffer, configured to receive a signal transmitted on the transmission line from the kth target die 304($k$). Input terminals of the input circuit 708 may be connected across a capacitive element C(C) of the controller die 102. The capacitive element may represent a die capacitance provided by the controller die 102. Also, the first and second paths 702, 704 may be terminated by a controller-side termination resistance $R_{ODT}$(C) provided by the on-die termination resistance of the controller die 102. The controller-side termination resistance $R_{ODT}$(C) may be connected in series a voltage source 710 to represent a voltage offset for the termination to accommodate a voltage offset of a data signal source of the kth die 304($k$) transmitting the signal.

For completion, the circuit model of FIG. 7 also includes an example single-ended transmission line 711 connecting the controller die 102 to the plurality of memory dies 304. The transmission line 611 in combination with the inductive and capacitive transmission line elements of the memory dies 304 shown in FIG. 7 may represent a complete single-ended transmission line between the controller die 102 and the memory dies 304.

Also, in FIG. 7, instead of input circuits, the circuit model of the single-ended transmission line is coupled to output (O/P) circuits 712 located on the memory dies 304, including a first output circuit 712(M1) on the first memory die 304(1), a second output circuit 712(M2) on the second memory die 304(2), and extending to a Nth output circuit 712(MN) on the Nth memory die 304(N). Each ith output circuit 712(Mi) may be configured to generate and output a single-ended signal on the single-ended transmission line, such as with as data signal source (e.g., a step digital signal source). As shown in FIG. 7, each ith output circuit 712(Mi) includes a first output terminal connected to a first end of an associated capacitive element C(Mi) and to the signal path 702, and a second output terminal connected to a second end of the associated capacitive element C(Mi) and to the ground path 704.

Referring to FIG. 8, the differential circuit model is similar to the differential circuit model of FIG. 6, in that it includes a first signal path 802 and a second signal path 804. Inductive elements of the first signal path are labeled LS1, and inductive elements of the second signal path are labeled LS2. In addition, the first signal path 802 is terminated with a first memory-side termination resistance $R_{ODT1}(M)$ provided by on-die termination resistance circuits 314 coupled to the first signal path 802 of the differential transmission line, and the second signal path 804 is terminated with a second memory-side termination resistance $R_{ODT2}(M)$ provided by the on-die termination resistance circuits 314 coupled to the second signal path 804 of the differential transmission line. The memory-side termination resistances $R_{ODT1}(M)$, $R_{ODT2}(M)$ are each connected to respective voltage sources 806(1), 806(2) to represent a voltage offset for the termination to accommodate a voltage offset of a data signal source of the kth die 304(k) transmitting the signal.

In addition, since a kth target die 304(k) is transmitting on the differential transmission line for the differential model of FIG. 8, the first signal path 802 is also terminated with a first controller-side termination resistance $R_{ODT1}(C)$ provided by on-die termination resistance circuits of the controller die 102 coupled to the first signal path 802 of the differential transmission line, and the second signal path 804 is terminated with a second controller-side termination resistance $R_{ODT2}(C)$ provided by on-die termination resistance circuits of the controller di 102 coupled to the second signal path 804 of the differential transmission line. The controller-side termination resistances $R_{ODT1}(C)$, $R_{ODT2}(C)$ are each connected to respective voltage sources 808(1), 808(2) to represent a voltage offset for the termination to accommodate a voltage offset of a data signal source of the kth die 304(k) transmitting the signal.

Also, similar to the single-ended model of FIG. 7, since a kth target die 304(k) is transmitting, the controller die 102 includes an input circuit 810, such as an input buffer, configured to receive the differential signal. The input circuit 810 includes terminals connected across a capacitive element C(C) representing on-die capacitance of the controller die 102, with a first input terminal connected to the first signal path 802 and a second input terminal connected to the second signal path 804.

For completion, the circuit model of FIG. 8 also includes an example differential transmission line 711 connecting the controller die 102 to the plurality of memory dies 304. The transmission line 611 in combination with the inductive and capacitive transmission line elements of the memory dies 304 shown in FIG. 7 may represent a complete differential transmission line between the controller die 102 and the memory dies 304.

In addition, similar to the single-ended model of FIG. 7, the differential transmission line is coupled to output circuits 812, each configured to generate and output a differential signal on the differential transmission line, including a first output circuit 812(M1) on the first memory die 304(1), a second output circuit 812(M2) on the second memory die 304(2), and extending to an Nth output circuit 812(MN) on the Nth memory die 304(N). Each ith output circuit 812(Mi) may include output terminals coupled across an associated capacitive element C(Mi) representing on-die capacitance of a respective memory die 304(i), and includes a first terminal connected to the first signal path 802 and a second terminal connected to the second signal path 804.

Referring back to FIG. 3, a characteristic impedance of the transmission line between the controller die 102 and the N-number of memory dies 304(1) to 304(N) may be modeled by its inductive and capacitive elements, and may be equal to or proportionate to the square root of an equivalent inductance of the inductive elements divided by an equivalent capacitance of the capacitive elements. In some example configurations, it may be desirable to increase the effective inductance in order to increase the characteristic impedance, such as in order to more closely match an end-die termination resistance. One way to do so is by increasing the inductance of one or more wire bond elements 310 of the transmission line.

Figure 9:
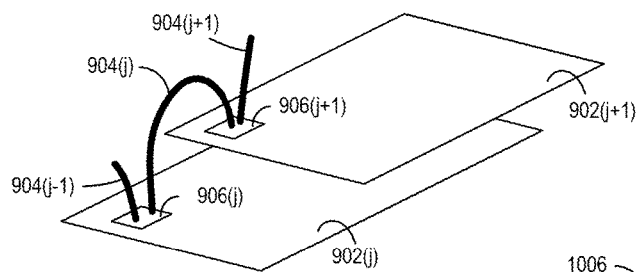
FIG. 9 is a perspective view of consecutive dies, where a wire bond element connecting contact pads of the consecutive dies includes a single wire bond.

FIG. 9 shows two adjacent dies 902(j), 902(j+1), which may be representative of two adjacent dies of the plurality of dies 304 of FIG. 3. FIG. 9 shows a jth wire bond element 904(j) as including a single wire bond that has a first end connected to and/or in contact with a jth contact pad 906(j) of the jth die 902(j) and a second end connected to and/or in contact with a (j+1)th contact pad 906(j+1) of the (j+1)th die 902(j+1). FIG. 9 also shows a (j−1)th wire bond element 904(j−1) connected to and/or in contact with the jth contact pad 906(j), and a (j+1)th wire bond element 904(j+1) connected to and/or in contact with the (j+1)th contact pad 906(j+1).

FIGS. 10-13 show different configurations of a jth wire bond element that includes a jth wire bond and that further includes an inductance-adding element that adds inductance to the jth wire bond element compared to a configuration of FIG. 9 that includes only a single wire bond (assuming the lengths of the wire bonds are equal). For some example configurations of a transmission line, at least one of the wire bond elements 310 may be configured to have an inductance-adding element, such as by having any of the configurations shown in FIGS. 10-13.

Figure 10:
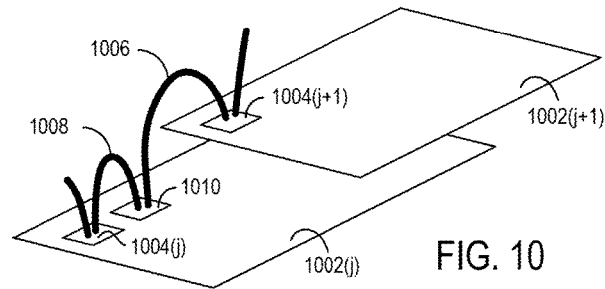
FIG. 10 is a perspective view of consecutive dies, where a wire bond element connecting contact pads of the consecutive dies includes a wire bond and an extra wire bond with ends connected to contact pads on the same die.

Referring specifically two FIG. 10, the inductance-adding element shown includes an extra or auxiliary wire bond with ends located or contacting contact pads located on the same die. For example, FIG. 10 shows two adjacent dies 1002(j) and 1002(j+1). The jth wire bond element connecting a jth contact pad 1004(j) located on the jth die 1002(j) with a (j+1)th contact pad 1004(j+1) located on the (j+1)th die 1002(j+1) may include a first wire bond 1006 and a second, extra, or auxiliary wire bond 1008. The jth wire bond element may further include a second, extra, or auxiliary contact pad 1010 located on the jth die 1002(j). In the example configuration shown in FIG. 10, the second wire bond 1008 may include a first end connected to and/or in contact with the jth contact pad 1004(j) and a second end connected to and/or in contact with the extra contact pad 1010 located on the jth die 1002(j). The first wire bond may include a first end connected to and/or in contact with the extra contact pad 1010 and a second end connected to and/or in contact with the (j+1)th contact pad 1004(j+1) located on the (j+1)th die 1002(j+1).

Figure 11:
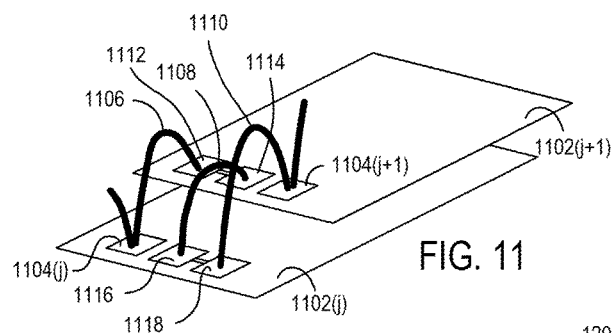
FIG. 11 is a perspective view of consecutive dies, where a wire bond element connecting contact pads of consecutive dies includes a wire bond and extra wire bonds, where each of the wire bonds has a first end connected to a contact pad on one die and a second end connected to a contact pad on the other die.

FIG. 11 shows a configuration where the inductance-adding element includes one or more extra wire bonds having opposing ends connected to and/or in contact with contact pads located on different memory dies. For example, FIG. 11 shows two adjacent dies 1102(j) and 1102(j+1). The jth wire bond element connecting a jth contact pad 1104(j) located on the jth die 1102(j) with a (j+1)th contact pad 1104(j+1) located on the (j+1)th die 1102(j+1) may include a first wire bond 1106. Additionally, in the example configuration shown in FIG. 11, the jth wire bond element further includes two extra wire bonds, including a second wire bond 1108 and a third wire bond 1110. Other configurations may include more or fewer extra wire bonds. Each of the first, second, and third wire bonds 1106, 1108, 1110 includes a first end connected to and/or in contact with a contact pad on the jth die 1102(j) and a second end connected to and/or in contact with a contact pad on the (j+1)th die 1102(j+1). In particular, the first wire bond 1106 may include a first end connected to and/or in contact with the jth contact pad 1104(j) and a second end connected to and/or in contact with a first extra contact pad 1112 on the (j+1)th die 1102(j+1). As shown in FIG. 11, a second extra contact pad 1114 located on the (j+1)th die 1102(j+1) may be connected to the first extra contact pad 1112. The second wire bond 1108 may include a first end connected to and/or in contact with a third extra contact pad 1116 located on the jth die 1102(j) and a second end connected to and/or in contact with the second extra contact pad 1114. A fourth extra contact pad 1118 may be located on the jth die 1102(j) and connected to the third extra contact pad 1116. The third wire bond 1110 may include a first end connected to and/or in contact with the fourth extra bond pad 1118 and a second end connected to and/or in contact with the (j+1)th contact pad on the (j+1)th die 1102(j+1).

In the example configuration shown in FIG. 11, the first, second, and third wire bonds 1106, 1108, 1110 may extend in the same direction so that their flux lines oppose each other in order to cause higher inductance. Also, adjacent wire bonds may have different heights (or have a height offset), which may avoid inductance reduction. Shown in FIG. 11 is a multiple wire-bond jump between adjacent dies 1102(j) and 1102(j+1), and similarly, a multiple jump wire-bond can be done on the same or a single jth die 1102(j) to increase inductance between die connections.

Figure 12:
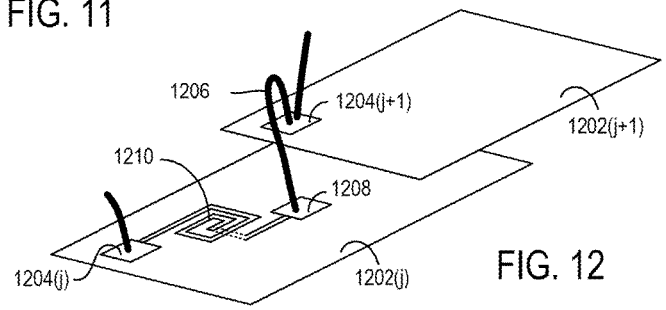
FIG. 12 is a perspective view of consecutive dies, where a wire bond element connecting contact pads of the consecutive dies includes a wire bond and a spiral element.

FIG. 12 shows a configuration where the inductance-adding element includes a spiral element. For example, FIG. 12 shows two adjacent dies 1202(j) and 1202(j+1). The jth wire bond element connecting a jth contact pad 1204(j) located on the jth die 1202(j) with a (j+1)th contact pad 1204(j+1) located on the (j+1)th die 1302(j+1) may include a wire bond 1206 having a first end connected to and/or in contact with an extra contact pad 1208 and a second end connected to and/or in contact with the (j+1)th contact pad 1204(j+1) on the (j+1)th die 1202(j+1). The jth wire bond element may further include a spiral element 1210, which may be a conductive trace forming a spiral path. The spiral element 1210 may include a first end connected to the jth contact pad 1204(j) and a second end connected to the extra contact pad 1208.

Figure 13:
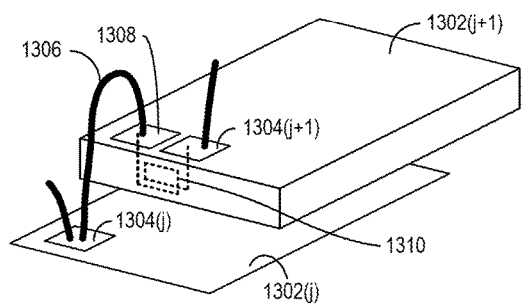
FIG. 13 is a perspective view of consecutive dies, where a wire bond element connecting contact pads of the consecutive dies includes a wire bond and a seal ring.

FIG. 13 shows an example configuration where the inductance-adding element includes a seal ring. For example, FIG. 13 shows two adjacent dies 1302(j) and 1302(j+1). The jth wire bond element connecting a jth contact pad 1304(j) located on the jth die 1302(j) with a (j+1)th contact pad 1304(j+1) located on the (j+1)th die 1302(j+1) may include a wire bond 1306 having a first end connected to and/or in contact with the jth contact pad 1304(j) and a second end connected to and/or in contact with an extra contact pad 1308 located on the (j+1)th die 1302(j+1). The jth wire bond element may further include a seal ring 1310 that includes a conductive ring or loop structure extending vertically—i.e., a direction perpendicular to the planar surfaces—in the (j+1)th die 1302(j+1). The seal ring 1310 may include a first end connected to and/or in contact with the extra contact pad 1308 and a second end connected to and/or in contact with the (j+1)th contact pad 1304(j+1).

Other configurations of wire-bond elements that include inductance-adding elements may be possible. For example, a single wire bond element may include a combination of the configurations shown in FIGS. 10-13. In addition, in at least some example configurations, a transmission line extending between the controller die 102 and the plurality of dies 304 may include at least one wire bond element 310 that includes an inductance-adding element having any of or a combination of the configurations shown in FIGS. 10-13. In particular example configurations, the wire bond elements 310 including an inductance-adding element may be periodic. That is, every Pth wire bond element 310 includes an inductance-adding element. To illustrate, if P is two, then every other wire bond element 310 includes a wire bond element that includes an inductance-adding element, and the other wire bonds include only a wire bond. Various configurations may be possible.

Also, in some example configurations, a given ith wire bond element 310(i) may an increased inductance compared to other wire bond elements 310 in a transmission line by increasing its length, in addition or alternatively to including an inductance-adding element. One way to increase the length of a wire bond is to increase an edge displacement distance of a pair of adjacent dies so that the edge displacement distance is longer that an edge displacement distance of another pair of adjacent. This aspect is illustrated in FIG. 14.

Figure 14:
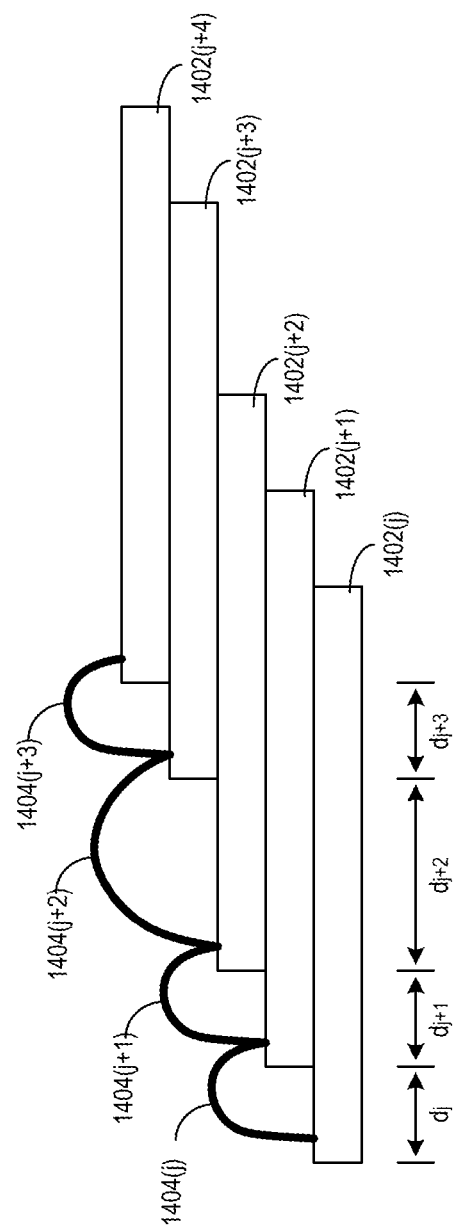
FIG. 14 is a side view of an example staircase stack, where an edge displacement distance is greater for a pair of dies of the stack compared to edge displacement distances of other pairs of dies of the stack.

FIG. 14 shows an example configuration that includes five dies 1402 configured as a staircase stack, including a jth die 1402(j), a (j+1)th die 1402(j+1), a (j+2)th die 1402(j+2), a (j+3)th die 1402(j+3), and a (j+4)th die 1402(j+4). The five dies 1402 may be representative of five of the N-number of dies 304 of FIG. 3. In the example configuration shown in FIG. 14, each next, adjacent die have edge that is offset or displaced from an edge of the previous adjacent die on which it is disposed. This edge displacement or offset may provide an exposed area for contact pads and wire bonds to contact the contact pads. A distance d may identify how far displaced an edge of given (i+1)th die 1402(i+1) is from an edge of a given ith die 1402(i). As shown in FIG. 14, a first edge displacement distance $d_j$ may identify how far an edge of the (j+1)th die 1402(j+1) is displaced from an edge of the jth die 1402(j), a second displacement distance $d_{j+1}$ may identify how far an edge of the (j+2)th die 1402(j+2) is displaced from the edge of the (j+1)th die 1402(j+1), a third edge displacement distance $d_{j+2}$ may identify how far an edge of the (j+3)th die 1402(j+3) is displaced from the edge of the (j+2)th die 1402(j+2), and a fourth edge displacement distance $d_{j+3}$ may identify how far an edge of the (j+4)th die 1402(j+4) is displaced from the edge of the (j+3)th die 1402(j+3).

In the example configuration shown in FIG. 14, wire bonds 1404 may connect contact pads (not shown in FIG. 14) of different dies. For example a jth wire bond connects a contact pad on the jth die 1402(j) with a contact pad on the (j+1)th die 1402(j+1), a (j+1)th wire bond connects a contact pad on the (j+1)th die 1402(j+1) with a contact pad on the (j+2)th die 1402(j+2), a (j+2)th wire bond connects a contact pad on the (j+2)th die 1402(j+2) with a contact pad on the (j+3)th die 1402(j+3), and (j+3)th wire bond 1404(j+3) connects a contact pad on the (j+3)th die with a contact pad on the (j+4)th die 1402(j+4).

In the example shown in FIG. 14, the third edge displacement distance $d_{j+2}$ of the pair of (j+2)th and (j+3)th dies 1402(j+2), 1402(j+3) is larger than the edge displacement distances of the other pairs of dies 1402. In turn, the length of the (j+2)th wire bond 1404(j+2) that traverses the third edge displacement distance $d_{j+2}$ may be larger than the lengths of the other wire bonds. In turn, the (j+2)th wire bond 1402(j+2) may have a larger inductance compared to the inductance of the other wire bonds 1402.

Additionally, in some example configurations, the signal quality of a signal may degrade as it propagates along the transmission line toward the end die 304(N). For example, as the signal propagates closer to the end die 304(N), the signal may experience lower signal-to-noise ratio, increased jitter, or a degradation in some other characteristic of the signal. This may be particularly the case as frequency or transmission rates of signals increase and/or the number of dies, such as of a die stack, increase. To improve the signal quality, a buffer, such as a series buffer, may be included as part of or in between wire bond elements.

Figure 15:
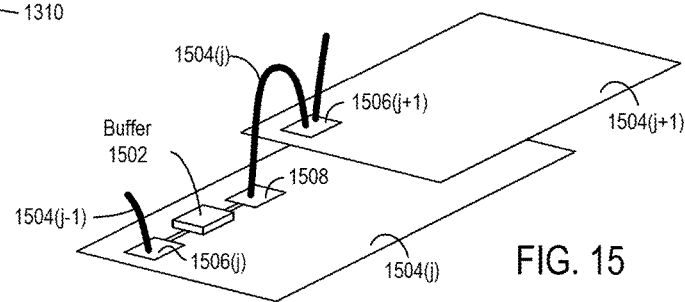
FIG. 15 is a perspective view of consecutive dies, where a buffer is disposed in between wire bond elements of a transmission line.

FIG. 15 shows an example configuration that includes a buffer 1502 included in a transmission line in between a jth wire bond 1502(j) and a (j−1)th wire bond 1504(j−1). The buffer 1502 is configured on a jth die 1504(j), and includes a first terminal (e.g, an input terminal) connected to a jth contact pad 1506(j) on the jth die 1504(j). The buffer 1502 may also include a second terminal (e.g., an output terminal) connected to an extra contact pad 1508 located on the jth die 1504(j). The jth wire bond 1504(j) may have a first end connected to and/or in contact with the extra contact pad 1508 and a second end connected to and/or in contact with a (j+1)th contact pad 1506(j+1) located on a (j+1)th die 1504(j+1). As a signal propagates along the transmission line toward the end die 304(N), the buffer 1502 may "clean up" the signal, such as by reducing jitter or other noise in the signal, as the signal propagates from the jth die 1504(j) to the (j+1)th die 1504(j+1).

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
   a stack of dies; and
   a controller die configured to:
     identify all of the dies of the stack as part of a same chip enable group; and
     transmit a single chip enable signal to the stack to receive a data signal from a target die of the stack for a read operation,
   wherein an end die of the stack of dies is configured to set an end-die termination resistance to a low resistance level in response to the single chip enable signal, the low resistance level less than or equal to 100 Ohms, and the end die comprising an end of a transmission line on which to communicate the data signal, and
   wherein the target die of the stack of dies is configured to:
     transmit the data signal on the transmission line to the controller die, the transmission of the data signal dependent on the end die of the stack of dies having set the end-die termination resistance circuit to the low resistance level.

2. The apparatus of claim 1, wherein the transmission line comprises a wire bond element comprising a wire bond and an inductance-adding element.

3. The apparatus of claim 2, wherein the inductance-adding element comprises an extra wire bond, a spiral, or a seal ring.

4. The apparatus of claim 1, wherein a first edge displacement distance of a first pair of adjacent dies of the stack is longer than a second edge displacement distance of a second pair of adjacent dies of the stack.

5. The apparatus of claim 1, wherein the transmission line comprises a buffer disposed on a die of the plurality of dies.

6. The apparatus of claim 1, wherein the low resistance level comprises a first low resistance level, and wherein the target die is configured to transmit the data signal on the transmission line to the controller die further dependent on a second-to-end die of the stack having set a second-to-end die termination resistance circuit to a second low resistance level, the second low resistance level being the same as or different than the first low resistance level.

7. The apparatus of claim 1, wherein the low resistance level comprises a first resistance level, and wherein the target die is further configured to transmit the data signal on the transmission line to the controller die further dependent on the target die having set a target die termination resistance to a second resistance level lower than the characteristic impedance of the transmission line.

8. The apparatus of claim 7, wherein the second resistance level is at least 50% lower than a characteristic impedance of the transmission line.

9. The apparatus of claim 1, wherein the plurality of dies is configured to have an effective termination resistance at a level that is within a range of resistance levels defined by plus-or-minus 20% of a characteristic impedance of the transmission line during transmission of the signal on the transmission line to the controller die.

10. The apparatus of claim 1, wherein the signal comprises a first signal, the transmission line comprises a first transmission line, and wherein the target die is further configured to receive a second signal on a second transmission line from the controller die, the receipt of the second signal on the second transmission line dependent on the target die having set a target die termination resistance circuit to a high resistance level.

11. The apparatus of claim 10, wherein the high resistance level is greater than ten times a characteristic impedance of the transmission line.

12. The apparatus of claim 1, wherein the transmission line comprises a single-ended transmission line.

13. The apparatus of claim 1, wherein the transmission line comprises a differential transmission line.

14. An apparatus comprising:
   a controller die;
   a die stack;
   a transmission line coupled to the controller die and to the die stack;
   target die of the die stack configured to:
     set a target die termination resistance circuit to a low resistance level that is lower than a characteristic impedance of the transmission line; and
     transmit a signal on the transmission line, the transmission dependent on the target on-die termination resistance circuit set to the low resistance level.

15. The apparatus of claim 14, wherein the low resistance level comprises a first low resistance level, the apparatus further comprising:
an end die of the die stack configured to set an end-die termination resistance circuit to a second low resistance level that is higher than the first resistance level, the transmission of the signal dependent on the end die setting the end-die termination resistance circuit to the second low resistance level.

16. The apparatus of claim 14, wherein the target die is further configured to:
receive a read command from the controller die; and
set the target die termination resistance circuit to the low resistance level in response to receipt of the read command.

17. The apparatus of claim 16, wherein the target die termination resistance circuit comprises a first termination resistance circuit, the target die comprising a second termination resistance circuit coupled to a second transmission line, the target die configured to receive the read command from on the second transmission line, and wherein the target die is configured to set the second termination resistance circuit to a high resistance level for receipt of the read command.

18. A system comprising:
a memory die stack; and
a controller die configured to:
receive a host command from a host device, the host command indicating to perform a memory operation with a target memory die of the memory die stack; and
in response to receipt of the host command, transmit a first signal on a first transmission line to the target memory die of the memory die stack, the transmission of the first signal dependent on an end memory die of the memory die stack having set a first end-die termination resistance circuit coupled to the first transmission line to a first low resistance level, and
wherein the target memory die, in response to receipt of the first signal, is configured to transmit a second signal on a second transmission line to the controller die, the transmission of the second signal dependent on the end memory die having set a second end-die termination resistance circuit coupled to the second transmission line to a second low resistance level, and further dependent on the target memory die having set a target on-die termination resistance circuit to a third low resistance level that is lower than a characteristic impedance of the second transmission line, the second low resistance level being the same as or different than the first low resistance level, and
wherein the first low resistance level and the second low resistance level are each lower Than or equal to 100 Ohms.

19. The system of claim 18, wherein the target on-die termination resistance circuit comprises a first target on-die termination resistance circuit, and wherein the transmission of the first signal is further dependent on the target memory die having set a second target on-die termination resistance circuit to a high resistance level.

20. The system of claim 19, wherein the memory die stack comprises at least one effective end memory die comprising the end memory die, wherein the transmission of the first signal is further dependent on remaining memory dies other than the target memory die and the at least one effective memory die having set respective on-die termination resistance circuit to associated high resistance levels, and wherein the transmission of the second signal is further dependent on the remaining memory dies other than the target memory die and the at least one effective memory die having set respective on-die termination resistance circuits to the associated high resistance levels.

21. The system of claim 18, wherein the host command comprises a host read command, wherein the first signal comprises a clock signal, and wherein the second signal comprises a data signal.

22. The system of claim 18, wherein the host command comprises a host write command, wherein the first signal comprises a data signal, and wherein the second signal comprises a status signal.

23. A system comprising:
means for receiving a host command from a host device, the host command indicating to perform a memory operation with a target memory die of a memory die stack;
means for transmitting a signal on a first transmission line to the target memory die, the transmitting of the first signal dependent on an end memory die of the memory die stack having set a first end-die termination resistance circuit coupled to the first transmission line to a first low resistance level; and
means for transmitting a second signal on a second transmission line in response to receipt of the first signal, the transmitting of the second signal dependent on the end memory die having set a second end-die termination resistance circuit coupled to the second transmission line to a second low resistance level and further dependent on the means for transmitting the second signal having set a target on-die termination resistance circuit to a third low resistance level that is lower than a characteristic impedance of the second transmission line, the second low resistance level being the same as or different than the first low resistance level,
wherein the first low resistance level and the second low resistance level are each lower than or equal to 100 Ohms.

* * * * *